United States Patent [19]

Senk et al.

[11] Patent Number: 5,760,715
[45] Date of Patent: Jun. 2, 1998

[54] PADLESS TOUCH SENSOR

[75] Inventors: Miro Senk, St-Laurent; Pierre Repper, Châteauguay, both of Canada

[73] Assignee: Pressenk Instruments Inc., St-Laurent, Canada

[21] Appl. No.: 843,365

[22] Filed: Apr. 15, 1997

Related U.S. Application Data

[60] Provisional application No. 60/014,638 Apr. 15, 1996.

[51] Int. Cl.⁶ .......................... H03K 17/94; H03M 11/00
[52] U.S. Cl. .......................... 341/33; 200/600; 345/173; 345/174; 341/26; 341/34; 361/181; 178/18
[58] Field of Search .......................... 200/600; 345/173, 345/174, 179; 341/26, 33, 34; 307/116, 109, 98, 99; 361/181; 178/17 C, 17 D, 18

[56] References Cited

U.S. PATENT DOCUMENTS

| | | | |
|---|---|---|---|
| 4,016,490 | 4/1977 | Weckenmann et al. | 361/181 |
| 4,175,239 | 11/1979 | Sandler | 361/181 |
| 4,221,975 | 9/1980 | Ledniczki et al. | 307/116 |
| 4,257,117 | 3/1981 | Besson | 368/69 |
| 4,321,479 | 3/1982 | Ledniczki et al. | 307/116 |
| 4,353,552 | 10/1982 | Pepper, Jr. | 463/37 |
| 4,550,310 | 10/1985 | Yamaguchi et al. | 340/365 |
| 4,556,871 | 12/1985 | Yoshikawa et al. | 340/365 |
| 4,561,002 | 12/1985 | Chiu | 340/365 |
| 4,651,133 | 3/1987 | Ganesan et al. | 340/365 |
| 4,806,809 | 2/1989 | Evans | 178/19 |
| 4,924,222 | 5/1990 | Antikidis et al. | 341/33 |
| 4,954,820 | 9/1990 | Kohno et al. | 340/825.69 |
| 5,012,124 | 4/1991 | Hollaway | 307/116 |
| 5,194,862 | 3/1993 | Edwards | 341/20 |
| 5,270,710 | 12/1993 | Gaultier et al. | 341/33 |
| 5,457,289 | 10/1995 | Huang et al. | 178/20 |
| 5,495,077 | 2/1996 | Miller et al. | 178/18 |
| 5,508,700 | 4/1996 | Taylor et al. | 341/33 |
| 5,526,294 | 6/1996 | Ono et al. | 364/709 |
| 5,526,428 | 6/1996 | Arnold | 380/25 |
| 5,534,857 | 7/1996 | Laing et al. | 340/825.34 |
| 5,577,121 | 11/1996 | Davis et al. | 380/24 |

*Primary Examiner*—Brian Zimmerman
*Assistant Examiner*—Timothy Edwards, Jr.
*Attorney, Agent, or Firm*—Merchant, Gould, Smith Edell, Welter & Schmidt

[57] ABSTRACT

The padless touch sensor is used for detecting a touch at a sensing location onto a dielectric element by a user coupled to earth. The sensor comprises a conductive plate attached under the dielectric element and in registry with the sensing location. A predetermined potential is applied on the conductive plate. Simultaneously, test pulses are produced into earth. When the user touches the dielectric element at the sensing location, a potential variation in the conductive plate is produced during a test pulse due to a capacitive circuit formed between earth, the user and the sensor. No deposition of conductive pads on the dielectric element or other special processes are required. Foreign matter or objects placed directly on top of the dielectric element will not erroneously produce a touch condition.

18 Claims, 10 Drawing Sheets

PADLESS TOUCH SENSOR

This application claims the benefit of U.S. Provisional Application No. 60/014,638, filed Apr. 15, 1996.

BACKGROUND

Conventional capacitive touch sensing systems employ a passive form of detection. In such sensor, there is an existing capacitive circuit driven by a source signal. A key touch, representing a change to the circuit capacitance, results in attenuating the potential and resulting voltage level change indicates a key touch. This capacitive circuit is usually implemented by the deposition of opposing conductive key pads to opposite sides of a dielectric element.

FIG. 1 shows an example of a conventional capacitive coupled touch sensor according to the prior art. FIG. 2 shows the equivalent circuit of the sensor shown in FIG. 1.

One problem with conventional sensors is that accumulation of foreign deposits on the key pads has the drawback of negating the effect of a touch by the user. Chemicals and abrasion of the exposed key pads can also degrade performance. Yet, different dielectric characteristics, such as thickness and dielectric constant, result in having to change or redesign the size of the key pads to achieve the same capacitance for a different dielectric element in identical applications.

Another type of conventional sensing system is a plastic membrane switch. Plastic membrane switches are not suitable for applications where they are located close to high temperature sources, such as on a cooktop surface. When a plastic membrane is located in the vicinity of a heat source, it would have a tendency to warp or separate. They are also susceptible to easy damage by heat and abrasion in a situation where it is normal that objects are used nearby or can be placed on the membrane. Actuation of this type of switch is mechanical in nature and reliability is inherently reduced with use.

Infra-red detection methods are sensitive to extraneous or even ambient light sources. Accumulation of foreign matter or objects placed over the sensing locations can affect sensitivity or produce erroneous detections. Moreover, the front plate or panel in front of the infra-red transmitters and detectors must be transparent for the technology to function.

SUMMARY

The object of the present invention is to provide a padless touch sensor employing direct capacitive coupling under a dielectric element, such as a glass window, a ceramic plate, etc. This sensor and the corresponding method have several important advantages over the traditional touch sensing systems and methods previously described.

According to the present invention, test pulses are sent to earth and when a user, standing by a sensor, touches the dielectric element at one sensing location, pulses are supplied to a conductive plate located under the dielectric element and in registry with the sensing location. These pulses are due to the capacitive reaction of the body of the user to the test pulses sent into earth. A coupling path is thus formed through the body capacitance with reference to earth.

One of the important advantages of the present invention is that it is only the touch of the user that is actively coupling the circuit and activating the sensor, unlike the traditional sensing systems that depend on disturbing an existing capacitive circuit.

The proposed touch sensor and method have several major impacts on overall system design. No conductive pads need to be deposited over the sensing location of the dielectric element for the system or method to function. The conductive plate of each sensor is instead provided in close contact with the opposite side of the dielectric element. This results in greater simplicity and flexibility with regards to the production and installation of a keyboard combining one or a plurality of sensors. Greater key density and a considerably smaller sensing location are possible compared to traditional capacitive sensing systems.

In particular, the present invention features a padless touch sensor for detecting a touch at a sensing location onto a dielectric element by a user coupled to earth. The sensor comprises a conductive plate attached under the dielectric element and in registry with the sensing location. A means is provided for applying a predetermined potential on the conductive plate. Test pulses are injected into earth using a pulse test generating means and a means responsive to a potential variation in the conductive plate produces an output signal indicative of that variation. In use, when the user touches the dielectric element at the sensing location, a potential variation occurs in the conductive plate during a test pulse due to a capacitive circuit formed between earth, the user and the means responsive to the potential variation.

The present invention also provides a padless touch sensor for detecting a touch at sensing locations onto a dielectric element by a user coupled to earth. The sensor comprises a plurality of conductive plates, one for each sensing location. Each conductive plate is attached under the dielectric element and in registry with a respective sensing location. A predetermined potential is successively applied on one of the conductive plates at once. A test pulse is produced into earth while one of the conductive plates receives the predetermined potential. A means responsive to a potential variation in the conductive plate with the predetermined potential is then provided for producing an output signal indicative of the potential variation in that conductive plate.

The present invention also provides a padless touch sensor for detecting a touch at sensing locations onto a dielectric element by a user coupled to earth. The sensor comprises a plurality of conductive plates, one for each sensing location. Each conductive plate is attached under the dielectric element and in registry with a respective sensing location. A means for applying a predetermined potential on the conductive plates is provided and test pulses are injected into earth. A means responsive to a potential variation in the conductive plates with the predetermined potential is then provided for producing output signals indicative of the potential variation in each of the conductive plates.

According to the present invention, there is also provided a method for detecting a touch at a sensing location onto a dielectric element by a user coupled to earth. The method comprises the steps of applying a predetermined potential on a conductive plate attached under the dielectric element and in registry with the sensing location. Test pulses are produced into earth and a potential variation on the conductive plate is sensed. An output signal indicative of the potential variation is then produced.

According to another aspect of the present invention, there is also provided a method for detecting a touch at sensing locations onto a dielectric element by a user coupled to earth. Each sensing location is provided with a corresponding conductive plate attached under the dielectric element and in registry with the respective sensing location. The method comprises the steps of successively applying a predetermined potential on one of the conductive plates at once. A test pulse is produced into earth each time the predetermined potential is applied on one conductive plate. A potential variation in each of the conductive plates is sensed while the predetermined potential is applied thereon. An output signal is then produced. The output signal is indicative of the potential variation in each of the conductive plates while the predetermined potential is individually applied thereon.

According to another aspect of the present invention, there is provided a method for detecting a touch at sensing locations onto a dielectric element by a user coupled to earth, each sensing location being provided with a corresponding conductive plate attached under the dielectric element and in registry with the respective sensing location, the method comprising the steps of:

applying a predetermined potential on the conductive plates;

producing test pulses into earth;

sensing a potential variation in each of the conductive plates; and producing output signals indicative of the potential variation in each of the conductive plates while they are being sensed.

A non restrictive description of preferred embodiments will now be given with reference to the appended drawings.

DESCRIPTION

Figure 1:
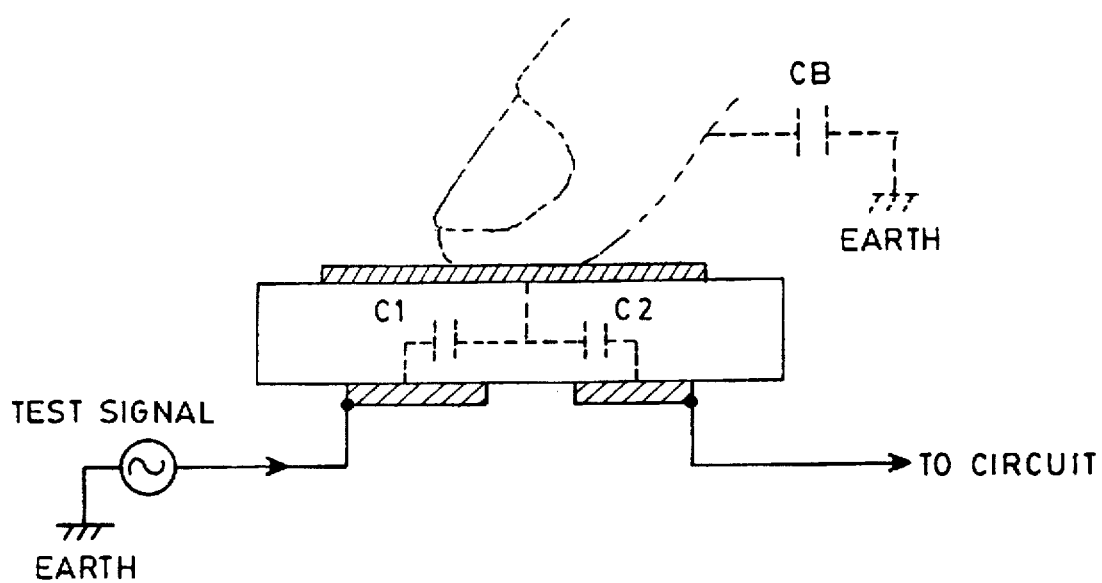
FIG. 1 is a schematic view of a capacitive coupled touch sensor according to the prior art.
Figure 2:
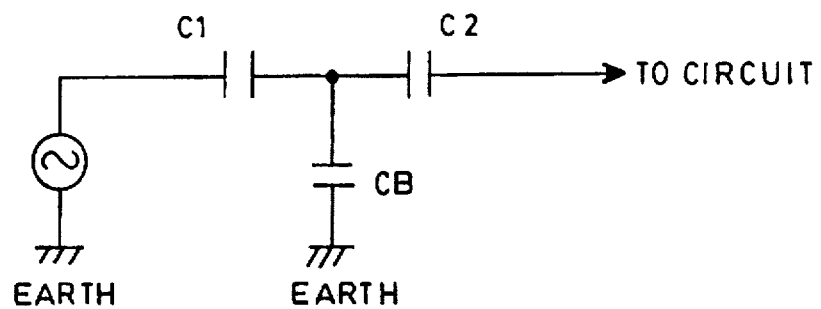
FIG. 2 is a schematic circuit diagram of the equivalent circuit of the sensor shown in FIG. 1.
Figure 3:
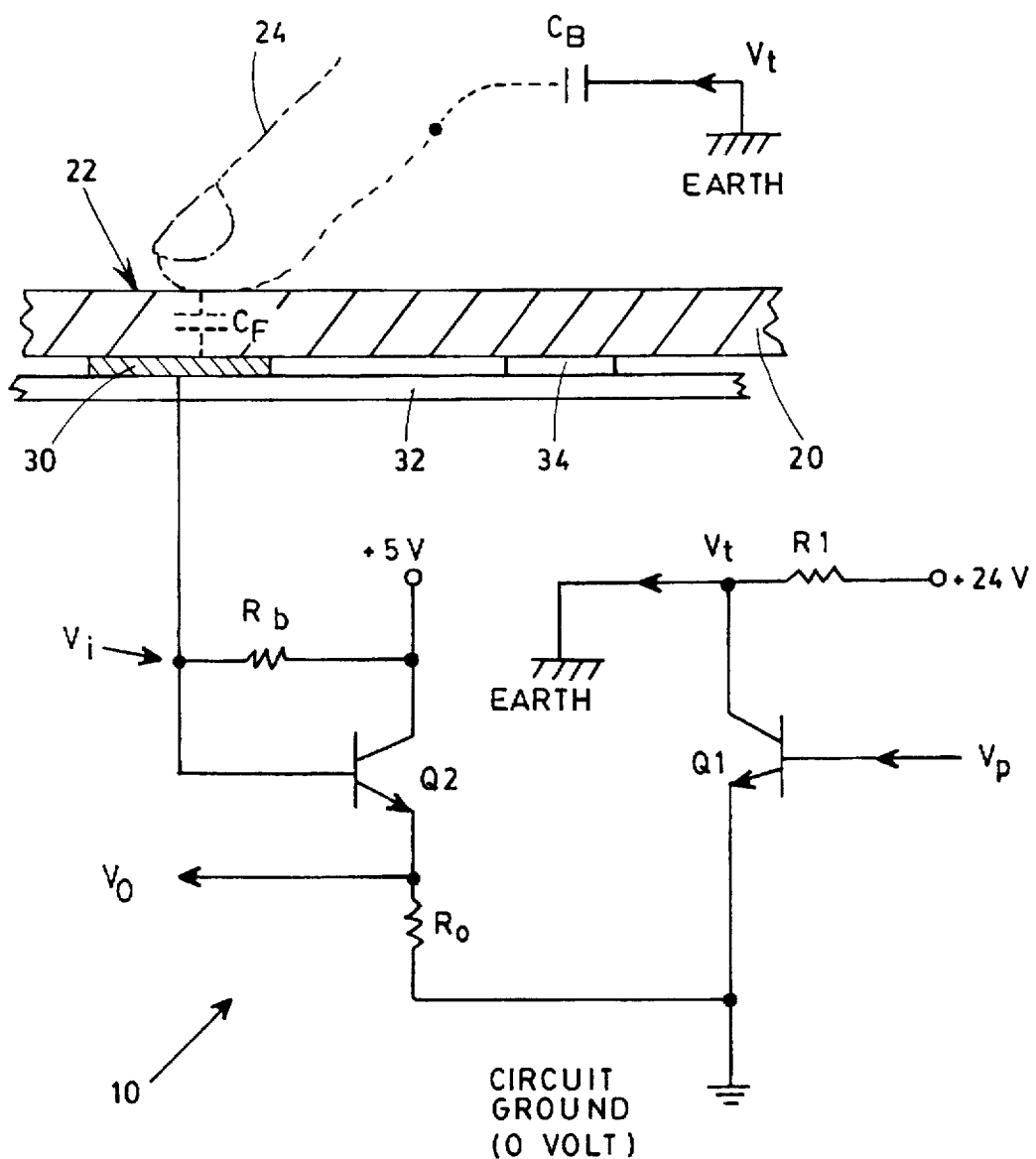
FIG. 3 is a schematic view of a basic padless touch sensor according to a possible embodiment of the present invention.

Referring to FIG. 3, there is shown a basic sensor (10) according to a possible embodiment of the present invention. The basic sensor (10) is mounted under a dielectric element (20) and is illustrated in a "touch" condition since the sensing location (22) on the dielectric element (20) is touched by a finger (24) of a user.

The basic sensor (10) can be divided in two main parts, namely a test pulse generator section and a receiver section. Those parts are described in detail hereinbelow.

Figure 4:
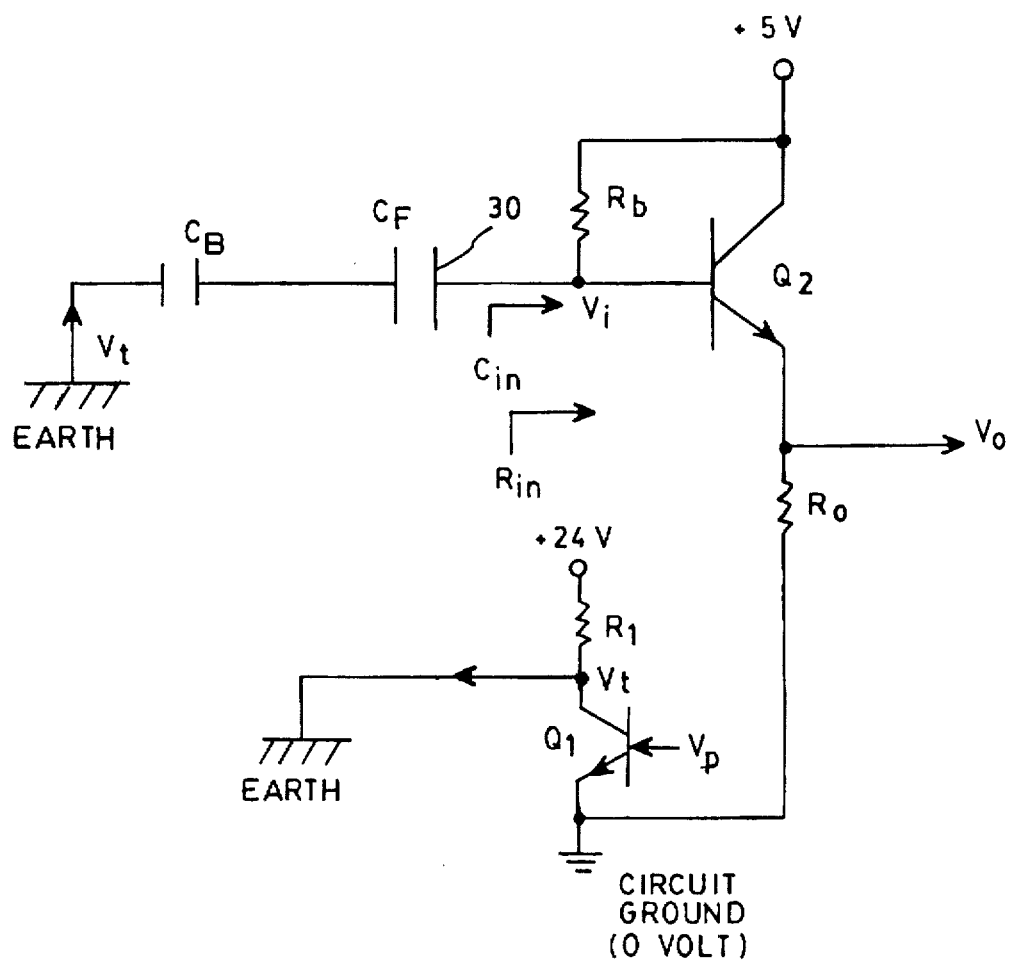
FIG. 4 is a schematic circuit diagram of the equivalent circuit of the basic sensor shown in FIG. 3.
Figure 5A:
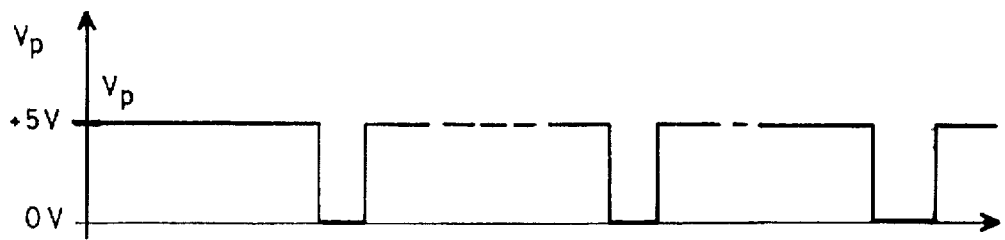
FIG. 5A is a graph showing an example of the pulse signal $V_p$ in function of time in the sensor of FIG. 3.
Figure 5B:
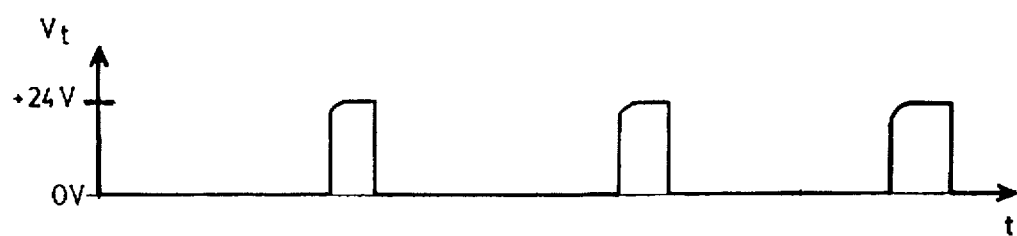
FIG. 5B is a graph showing an example of the pulse test signal $V_t$ in function of time in the sensor of FIG. 3.
Figure 12:
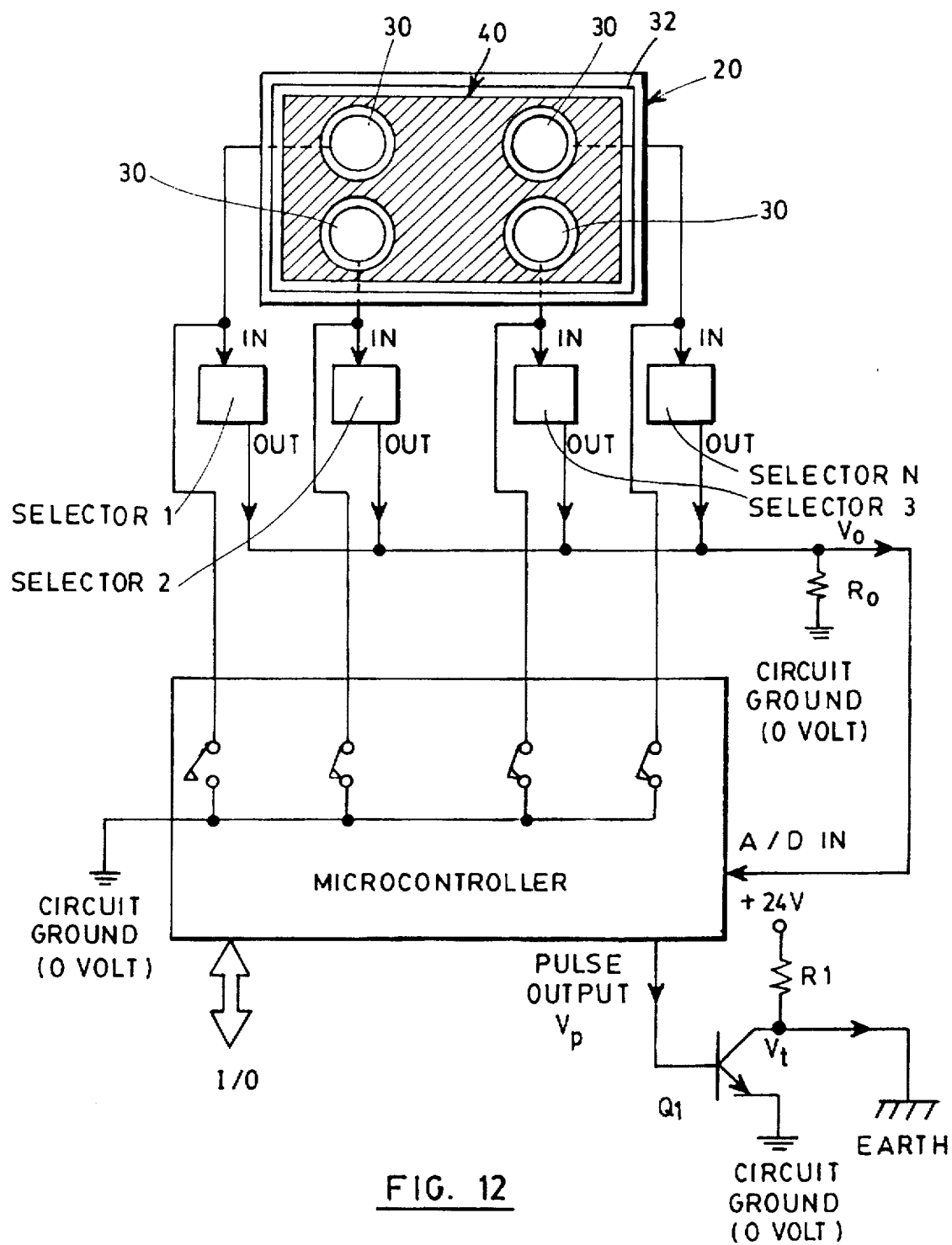
FIG. 12 is a schematic view of a sensor with multiple keys, according to a preferred embodiment of the present invention.

The test pulse generator section produces test pulses into earth. Preferably, the test pulse generating means comprises a resistor having an input terminal connected to a DC source and an output terminal connected to earth. The output terminal of the resistor is also connected to the collector of a transistor. The emitter of the transistor is then connected to the circuit ground. A pulsed signal is generated at the base of the transistor. FIGS. 3, 4 and 12 show such construction. In this embodiment, a +24 volts DC potential is applied through a resistor R1 that is connected to earth. A typical value for the resistor R1 would be 10 Kohms. A transistor Q1 alternatively connects and disconnects the circuit ground to and from earth. A pulse signal $V_p$ of +5 volts for instance, arrives at the base of the transistor Q1. The circuit ground and earth are disconnected whenever $V_p$ drops to 0 volt. This applies a +24 volts, with reference to the circuit ground, at the opposite side of the resistor R1. As soon as the pulse signal $V_p$ is back to the +5 volt level, the transistor Q1 is switched on again and the circuit ground and earth are connected together, dropping $V_t$ to 0 volt. FIGS. 5A and 5B respectively show the pulse signal $V_p$ and the resulting test pulse signal $V_t$ that is injected into earth.

Earth in the context of the present invention means the real earth or any other mass acting as a virtual ground. For instance, in case of an appliance, the sensor can be connected to the real earth by means of a wire electrically connected to the grounding prong of the appliance, itself connected to the earth wire of the building. As for the virtual ground, an example could be the metallic body of a vehicle.

The receiver section of the basic sensor (10) comprises a conductive plate (30) located under the dielectric element (20). The plate (30) is in registry with the sensing location (22) onto the dielectric element (20). The sensing location (22) and the corresponding conductive plate (30) are also referred to as a "key". If appropriate, markings may be provided to indicate to the user the exact location where the finger (24) has to touch to achieve a touch condition at the key. Of course, a person skilled in the art would realize that the term "finger" may be substituted for any body part that can be used for touching a key. For instance, a handicapped person may have to use his or her toes instead of one finger. The present invention may also work in applications where animals are involved.

The receiver section further comprises a means for applying a predetermined potential on the plate (30). This sets a reference voltage, referred to as a "no touch" reference level. Then, a means responsive to a potential variation in the plate (30) is used to produce a signal indicative of the potential variation. It is this signal that will be used to determine if there is a touch condition or not.

As aforesaid, the plate (30) is attached under the dielectric element (20). There are many ways of achieving the connection. One is to provide the plate (30) on a circuit board (32) and to connect the circuit board (32) with, for instance, an adhesive strip (34) or with screws (not shown). Of course, other kinds of attachments may be used, according to the particular needs and environment.

FIG. 3 shows a possible embodiment of the present invention, where the means for applying a predetermined potential and the means responsive to a potential variation in the plate (30) are combined together using a transistor Q2. FIG. 4 shows the equivalent circuit when there is a touch condition, also referred to as a "key touch".

The transistor Q2 is connected in a high input impedance emitter follower configuration. The voltage gain of the circuit is slightly less than 1. A resistor $R_b$ is connected between the base of the transistor Q2 and a second supply voltage source. The resistor $R_b$ serves as a termination and bias for the input and sets the "no touch" reference level at an output resistor $R_o$. The other end of the resistor $R_o$ is connected to the circuit ground.

A typical second supply voltage would be +5 volts DC. The input resistance $R_{in}$ at the base of the transistor Q2 is approximately given by the formula $h_{FE} \times R$. The input resistance $R_{in}$ is then approximately between 0.5 Mohm and 2 Mohms for a typical transistor when the resistor $R_o$ is 4.7 Kohms and $h_{FE}$ between 100 and 400. Decreasing the value of the resistor $R_b$ raises the potential at the base of the transistor Q2 and also the "no touch" reference level. For instance, this level can be adjusted from +0.6 volt to +3.4 volts by adjusting the resistor $R_b$ from 5.6 Mohms to 200 Kohms. The detection level at the output resistor $R_o$ can also be adjusted by changing the value of the resistor $R_b$ to compensate for different coupling levels for various sizes of the conductive plates (30). Any convenient reference level can be chosen depending on the application and power supply voltage available.

In use, the $V_p$ test pulse signal drives the transistor Q1 which alternatively connects and disconnects the circuit ground to and from earth. In the illustrated embodiment, the first supply voltage is +24 volts DC and when the transistor Q1 is switched off, the +24 volts DC is applied through the resistor R1 to earth for producing the test pulse signal $V_t$. FIGS. 5A and 5B show the typical waveforms. Preferably, the test pulse signal $V_t$ is applied once every 1 ms.

The test pulse signal $V_t$ is coupled from earth to the capacitance $C_B$ of the body of the user. When there is no key touch, the potential at the conductive plate (30) will not change. Nevertheless, the est pulse $V_t$ is always being injected into ground and coupled to the user's body. Experiments have shown that the distance between the user and the test pulse generator section may be as far as 50 meters. A shielded cable was used to connect the plate (30) to the remote circuit board (32).

When there is a key touch, like in FIGS. 3 and 4, the touch detection is achieved by coupling the +24 volts DC test pulse signal through the user's effective body capacitance, to the plate (30), by way of earth. The test pulse signal $V_t$ is applied to earth and to one side of body capacitance $C_B$. The value of the capacitance $C_B$ is typically between 200 and 500 pF. During a key touch, the capacitance $C_B$ is connected in series to the capacitance $C_F$, which represents the capacitance formed by the user's contact area at the sensing location (22), the dielectric element (20) and the conductive plate (30). A typical value of the capacitance $C_F$ is 20 pF for a ⅛ inch thick glass-ceramic with a dielectric constant of 22 and a plate area of about 0.5 square inch. A material with a higher relative dielectric constant increases the capacitance $C_F$ and produces improved signal coupling to the sensor or alternatively, allows the use of a thicker dielectric element (20). Increasing the thickness of the dielectric element (20), with the area of the plate (30) remaining constant, decreases the value of $C_F$ and the resulting coupling to the sensor.

The capacitance for parallel plates is given by the following general formula:

$$C = keA/d$$

wherein,

A is the area of plates, d is the distance between the plates, e is a constant, and k is the relative dielectric constant.

One can see that for a dielectric element of a specific thickness, the area of the conductive plate (30) and the contact area of the finger (24) determines the value of the capacitance $C_F$. Increasing the contact area will increase the capacitance and improve coupling of the test pulse signal $V_t$ to the sensor. The maximum area is however limited by the contact area for a typical human finger, beyond which increasing the area of the plate (30) has no effect. A circular plate of ½ inch diameter is a reasonable maximum useable limit to set for finger actuation. However, a ¼ inch diameter plate works very reliably.

When the test pulse signal $V_t$ goes from 0 volt to +24 volts, the capacitance $C_B$ and $C_F$ acts instantly as a "short" and +24 volts would normally be applied to the base of the transistor Q2. The effective capacitance of $C_B$ and $C_F$ in the example is approximately 18 pF. Since the input base capacitance $C_{in}$ of the transistor Q2, which is in the range of 5 pF to 10 pF for a typical transistor, is comparable to the coupling capacitance of $C_B$ and $C_F$ combined, the signal level that the transistor Q2 receives is actually lower than +24 volts. The input resistance of the transistor Q2 also acts to reduce the level depending on the coupled resistance. The rise time of the test pulse signal $V_t$ also acts to further reduce this level. If this time is comparable or greater than the time constant of the input resistance of the transistor Q2 and the coupling capacitance ($C_B$ and $C_F$), the coupled signal level is further reduced. The transmitted test pulse signal $V_t$ from earth generally does not have a very sharp rise time. The effective signal coupled to the transistor Q2 is thus much lower than +24 volts, and typically is +0.3 volt.

Figure 5C:
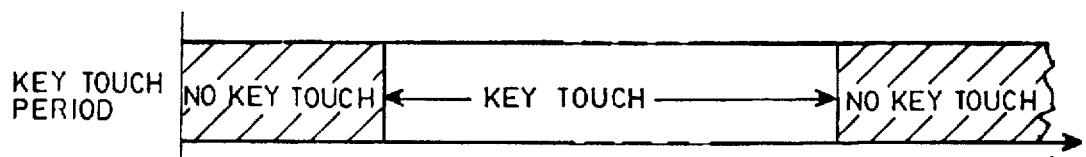
FIG. 5C is a schematic representation of an example of a key touch scenario in function of time.
Figure 5D:
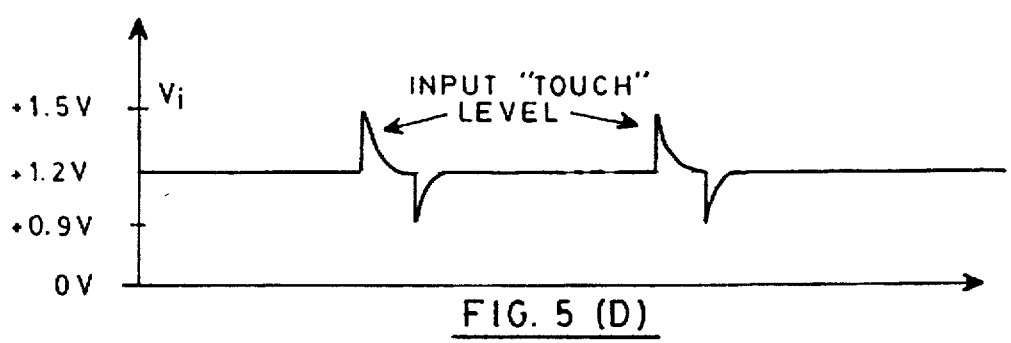
FIG. 5D is a graph showing an example of the input signal $V_i$ representing the potential of the conductive plate in function of time in the sensor of FIG. 3 and during the key touch scenario of FIG. 5C.
Figure 5E:
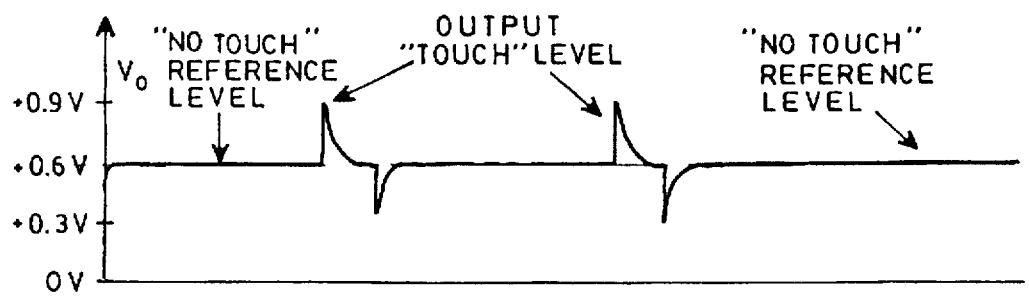
FIG. 5E is a graph showing an example of the output signal $V_o$ representing the potential at the output of the transistor Q2 in function of time in the sensor of FIG. 3 and in response to the input signal $V_i$ shown in FIG. 5D.

FIG. 5C shows an example of a key touch period with reference to the test pulse signal $V_t$ shown in FIG. 5B. FIG. 5D then shows the resulting variation of the potential in the plate (30). FIG. 5E shows how the potential variation is felt at the emitter of the transistor Q2. The output signal $V_o$ is sent to an appropriate device to determine whether or not the potential variation is sufficient to initiate a positive key touch status and, for instance, actuate a corresponding switch (not shown).

Figure 6:
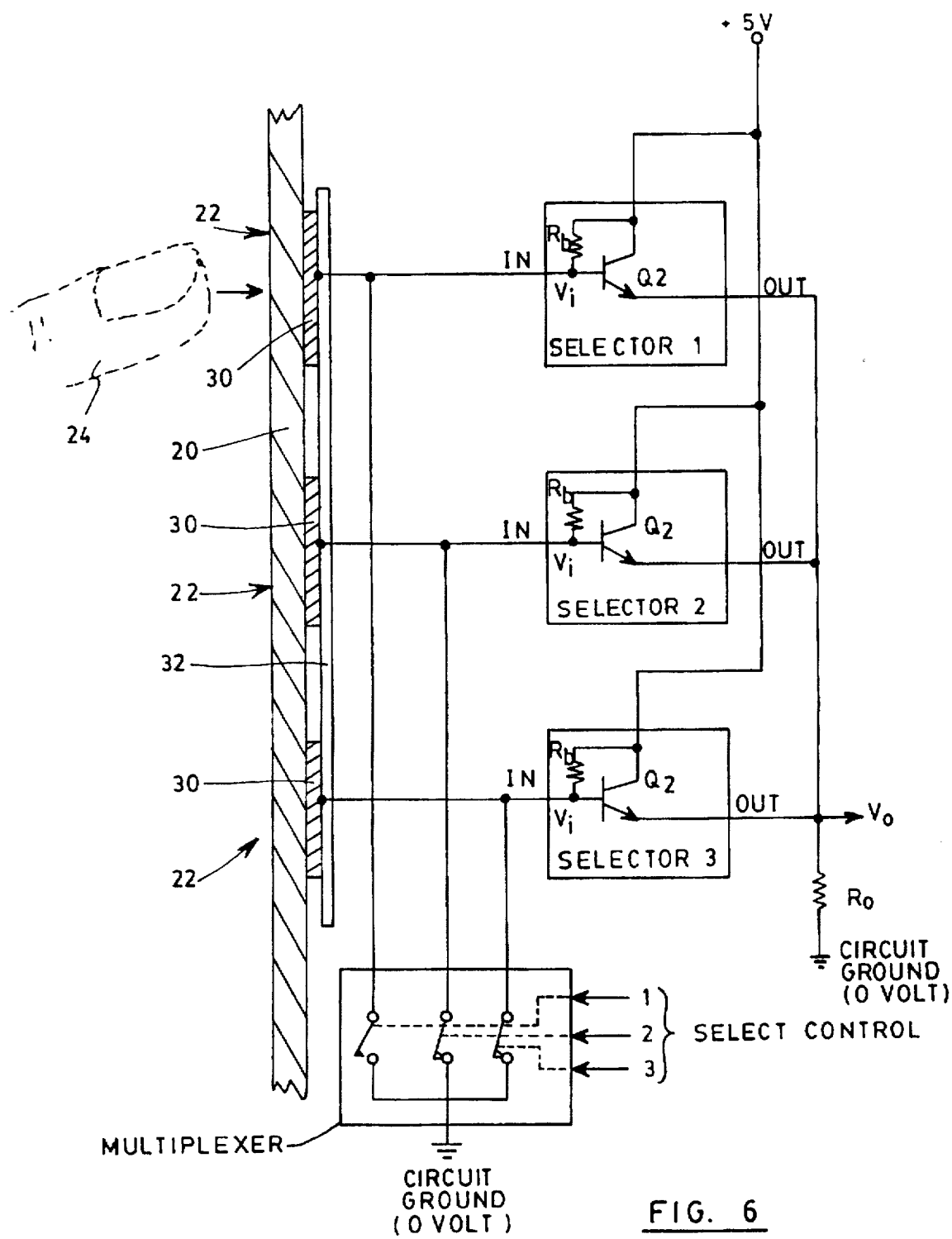
FIG. 6 is a schematic view of a padless touch sensor with multiple keys, according to a preferred embodiment of the present invention, shown without the test pulse signal generator.

FIG. 6 shows a multiple key configuration. The keys are each individually scanned to determine whether there is a key touch or not. The input to the base of the selected key transistor is left active (enabled) while the inputs to the other keys are disabled by grounding their input bases through a multiplexer. The individual key transistor Q2 and resistance $R_b$ are called a "selector".

Figure 7A:
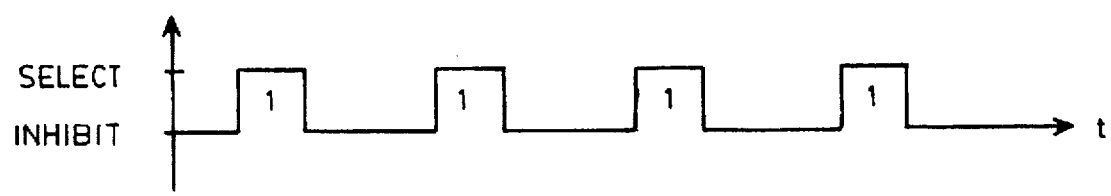
FIG. 7A is a schematic representation in function of time of the selection of the first key of FIG. 6.
Figure 7B:
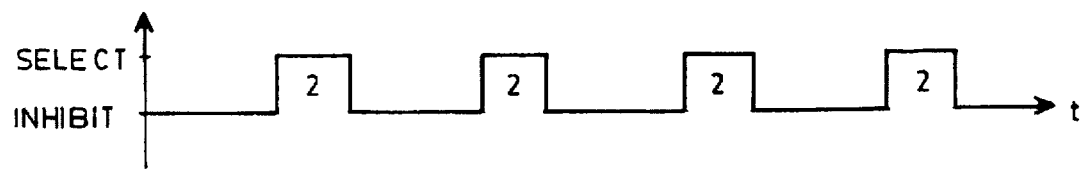
FIG. 7B is a schematic representation in function of time of the selection of the second key of FIG. 6.
Figure 7C:
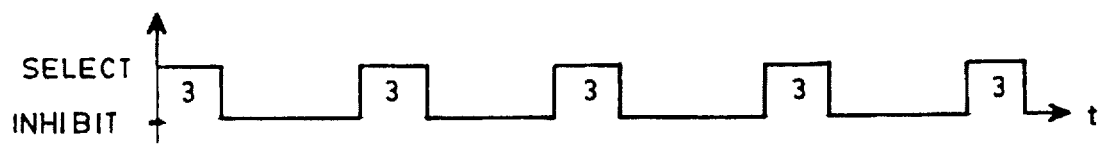
FIG. 7C is a schematic representation in function of time of the selection of the third key of FIG. 6.

FIGS. 7A, 7B and 7C illustrate schematically the selection of the individual keys. When a key is selected, the test pulse signal is coupled to that key only if there is a touch at the corresponding sensing location. It should be noted that the test pulse generator section was omitted from FIG. 6 for simplification. FIG. 12 shows the complete system with "N" keys.

Figure 7D:
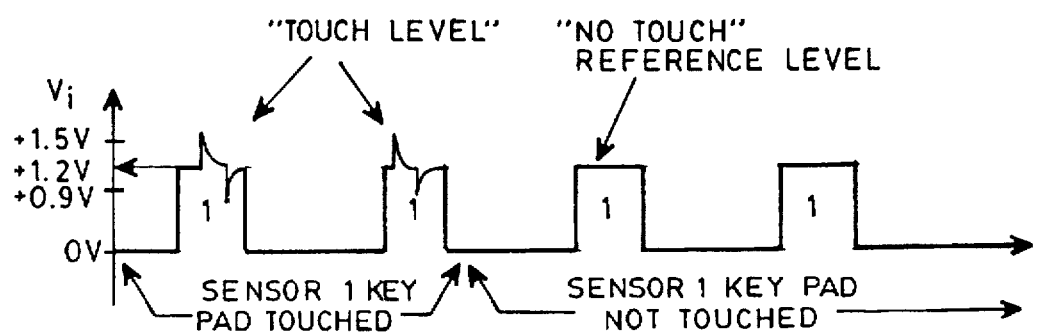
FIG. 7D is a graph showing an example of the input signal $V_i$ representing the potential of the conductive plate of the first key of FIG. 6 in function of time and following the key selection shown in FIG. 7A.
Figure 7E:
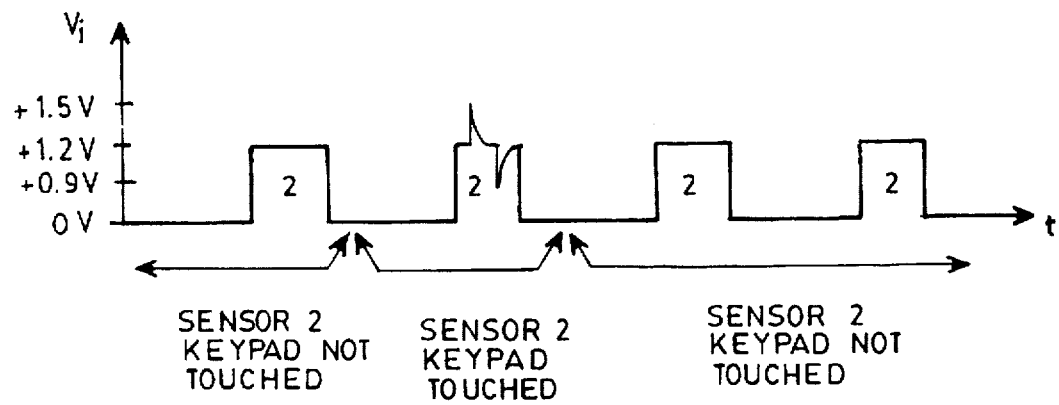
FIG. 7E is a graph showing an example of the input signal $V_i$ representing the potential of the conductive plate of the second key of FIG. 6 in function of time and following the key selection shown in FIG. 7B.
Figure 7F:
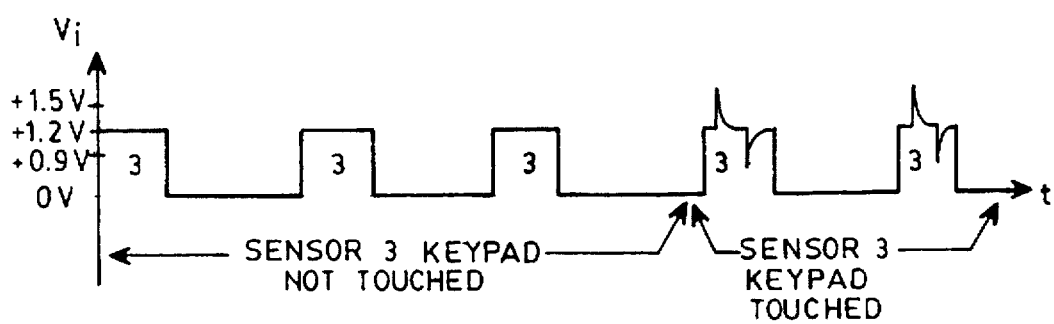
FIG. 7F is a graph showing an example of the input signal $V_i$ representing the potential of the conductive plate of the third key of FIG. 6 in function of time and following the key selection shown in FIG. 7C.

FIG. 7D shows an example of the input voltage $V_i$ for the first key. In the given example, the first key is touched in the first two readings of that key, while there is no key touch for the other two readings. FIG. 7E shows the input voltage $V_i$ for the second key, showing the signal if only the second key is touched during the second reading. FIG. 7F shows the output voltage $V_i$ for the third key, showing the signal if only the third key is touched during the last two readings.

Figure 7G:
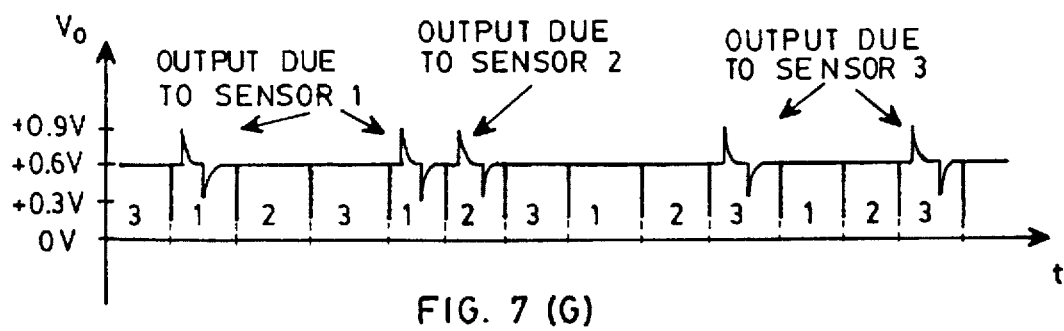
FIG. 7G is a graph showing an example of the resulting output signal $V_o$ representing the potential at the output of the transistor Q2 in function of time in the sensor of FIG. 6 and in response to the input signals $V_i$ shown in FIGS. 7D, 7E and 7F.

FIG. 7G shows the resulting output signal $V_o$ in function of time. It should be noted that any stray or inadvertent coupling to any of the other disabled keys has no effect on the output voltage $V_o$ at the resistor $R_o$ for the time period that the first key is selected, for instance. Only the first key contributes to the voltage $V_o$ for that time period. Every other key is then subsequently scanned in a similar manner with the voltage level present at a common output resistor $R_o$, indicative of the presence of a key touch for that particular key. When there is no key touch, the output signal $V_o$ remains at its reference no touch level for the scanned key. It should be noted at this point that it is possible to provide an output resistor $R_o$ for each key.

One of the advantages of the present invention is that no deposition of conductive films on the dielectric element (20) or other special processes are required. The dielectric element (20) not only protects the sensor from the external operating environment, it acts in completing the capacitance construction of $C_F$. The only conductive plates contributing to the coupling capacitance are behind the dielectric element (20) and are then protected from the action of chemicals and abrasion.

Heat sensitivity is not an issue. For instance, the circuit board (32) does not have the same tendency to warp or distort like the conventional plastic membrane switch type construction. Moreover, foreign matter or objects placed directly on top of the dielectric element (20) will not erroneously actuate any of the keys. Infra-red based systems do not preclude this possibility.

Figure 8:
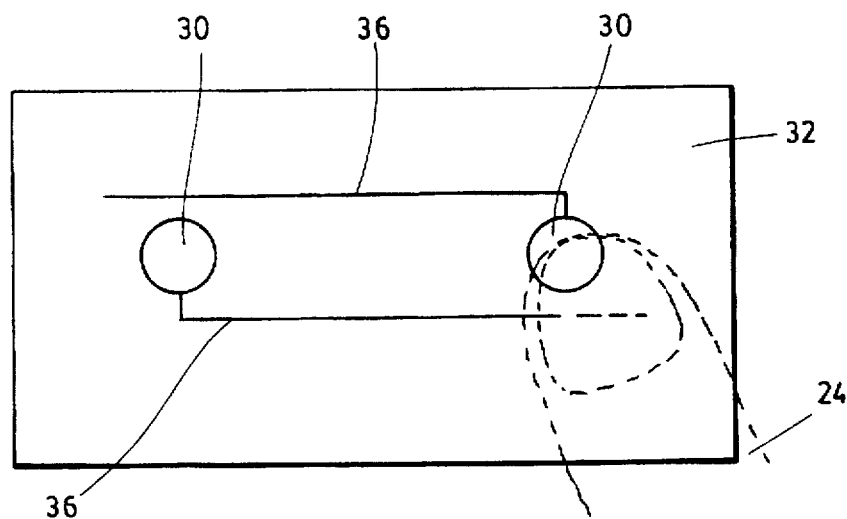
FIG. 8 is a schematic view of an example of a touch at a sensing location which overlaps different traces.
Figure 9:
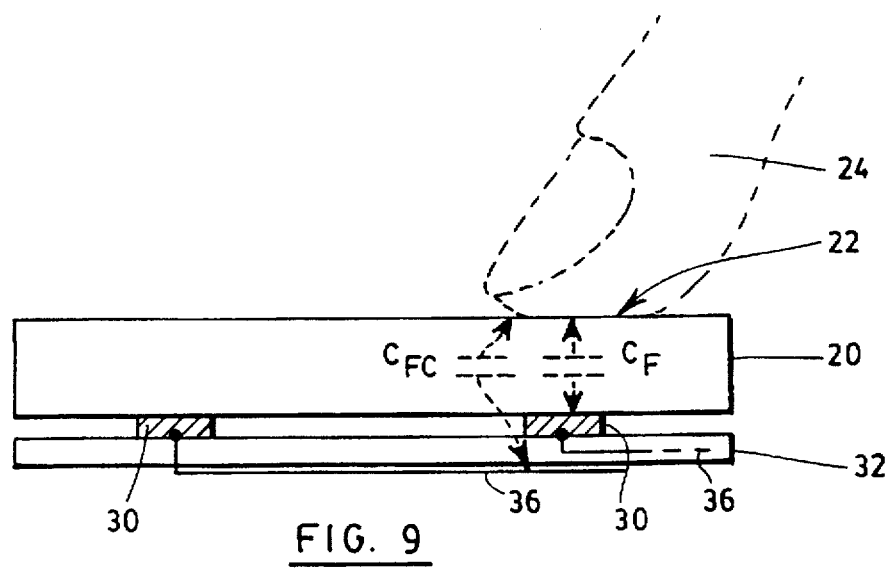
FIG. 9 is a schematic circuit diagram of the equivalent circuit of the sensor shown in FIG. 8.
Figure 10:
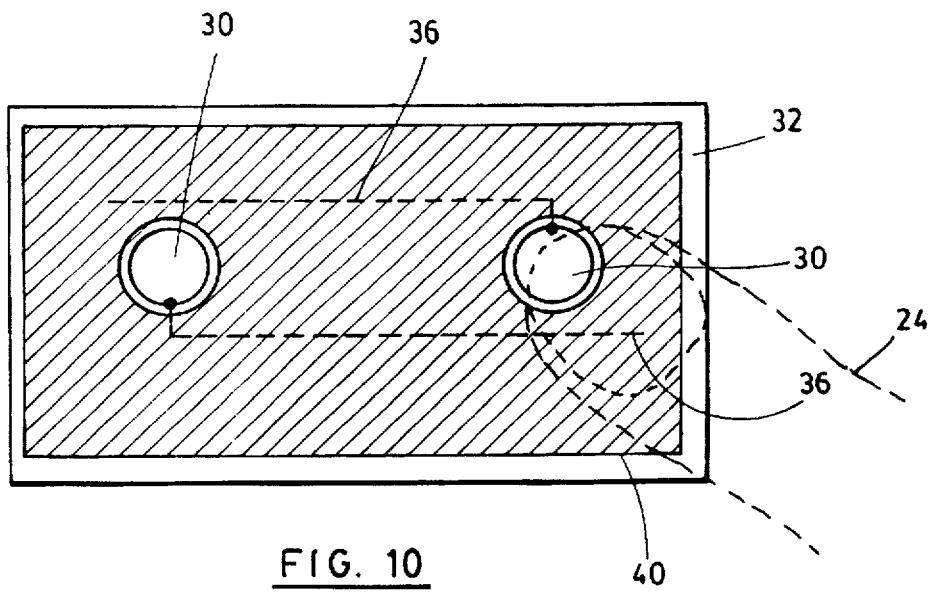
FIG. 10 is a schematic view of an example of a sensor with a grounding plate.
Figure 11:
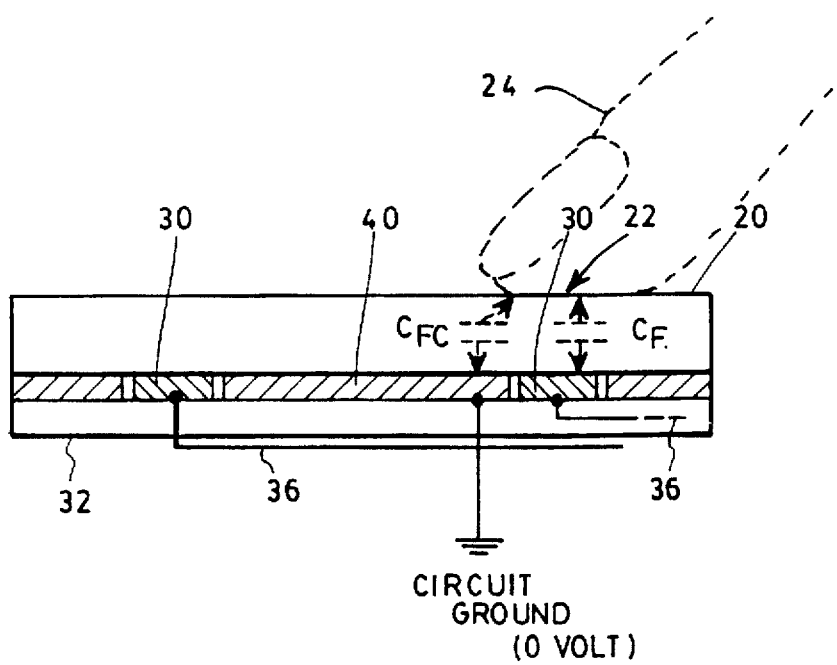
FIG. 11 is a schematic circuit diagram of the equivalent circuit of the sensor shown in FIG. 10.

As with traditional capacitive touch sensing systems, special considerations must be taken into account in designing the circuit board (32). As shown in FIG. 8, when a conductive trace (36) connected to a conductive plate (30) runs close to another plate (30), a key touch at a certain sensing location (22) may overlap a different sensor trace (36). The dielectric capacitance $C_F$ from the user to the overlapped adjacent trace could couple some of the signal $V_i$ to the corresponding key ($C_{FC}$), as shown in FIG. 9. Efforts to reduce this effect as much as possible result in improved determination of a key touch. This effect is minimized by making the traces (36) as thin as possible, thus reducing undesired capacitive coupling. Surrounding the sensing locations (22) on the outward facing or user side of the circuit board (32) by a circuit ground plane (40), as shown in FIGS. 10 and 11, has the effect of shielding all conductive traces behind it. A key touch at a sensing location (22) which also overlaps another trace now has its capacitance $C_{FC}$ to the overlapped trace (36) coupled to circuit ground. Furthermore, a minimum number of conductive traces (36) should run on the outward facing side of the keyboard to be able to make effective use of the shielding.

FIG. 12 illustrates conductive plates (30) and circuit ground plane (40) that are etched on the outward facing side of a circuit board (32). A dielectric element (20) covers and is in close contact with the keys. The outputs of all the corresponding selectors are connected to a common output resistor $R_o$. As aforesaid, it is possible to provide a separate output resistor $R_o$ for each key. This would however require more than one output channel. A microcontroller provides the necessary signals for scanning the selector of each key of the array. Measurement and analysis of the potential variations at the output resistor $R_o$ is performed by the microcontroller. A determination of whether a valid key touch has been received and the appropriate reaction is then performed.

In use, the keys in FIG. 12 are scanned in succession, in an order prescribed by the microcontroller program. At the beginning of the process, the microcontroller sends a pulse to the transistor Q1. The transistor Q1 raises earth potential to +24 volts above circuit ground when the input pulse $V_p$ is zero Volt. When a particular key is scanned, the microcontroller disables all the other keys. This may be done by grounding every transistor base of the selectors except the one that it is scanning if one output resistor $R_o$ is used.

The output voltage $V_o$ is connected to the A/D input channel of the microcontroller which is read and recorded in memory. The microcontroller then enables the next key and disables all the others and proceeds in the same manner as previously described until all the keys have been scanned. The microcontroller then suspends the scanning in order to evaluate the potential levels for $V_o$ detected during each key scan period. The microcontroller initially records the "no key touch" reference level $V_o$ for each key. The current recorded $V_o$ level for a particular key is then compared with the reference "no key touch" value. If the potential $V_o$ is greater than the reference by a predetermined reference value, then a "possible key touch" is recognized as to have occurred. This "difference level" represents the detection level range for the key. The potential variations for a possible "key touch" for each of the other keys during their scan period are similarly generated. The key which has the largest potential variation is then recognized as being "most probably" touched. This sequence of events is performed several times. When a particular key consistently produces the largest potential variation, the corresponding key is accepted as being "touched". Typically a difference level of +0.2 volt produces acceptable results.

When the microcontroller encounters a multiple "key touch" situation, the recorded "no key touch" reference level in memory for the respective keys will be adjusted to a new value such that the potential variation calculated by the microcontroller will always be less than the "possible key touch" detection range. Those keys will thus be forced to be seen as "not touched" and be effectively locked out. The scanning of the keys then proceeds normally. When the multiple touch condition disappears, the "no touch" reference levels for those keys are returned to their normal values in memory.

The microcontroller is provided with a proper program to perform the steps of the method according to the present invention. An example of such a program is as follows. This program was written for a sensor used in conjunction with an electric range having a ceramic cooktop surface.

20

```
                ; BY FENG ZHOU  11/11/96
                ; CALDERA top element controller program
                ; DOT FLASHING,7SEC FLASHING,ALARM,KEYBOARD LOCK DEBUG
                ; remove the 4th flash when initialization & flash "4" to start on
 5              calde2.asm
                ; 2nd production program
                ; CALDIS1.SCH,CALPB1.SCH,CALKEY.SCH ORG 2000H
10              ;GGGGGGGGGGGGGGGGGGGGGGGGGGGGGGGG
                PORTA   EQU 00H
                PORTB   EQU 01H
                PORTC   EQU 02H
                PORTD   EQU 03H
15              PORTE   EQU 04H
                PORTF   EQU 05H
                PORTG   EQU 06H DRA     EQU 07H
20              DRB     EQU 08H
                DRC     EQU 09H
                DRD     EQU 0AH
                DRE     EQU 0BH 25              RTCHA   EQU 0CH
                RTCMA   EQU 0DH
                RTCSA   EQU 0EH
                RTCH    EQU 0FH
                RTCM    EQU 10H
30              RTCS    EQU 11H

TCR     EQU 12H
                TSR     EQU 13H

35              ICH     EQU 14H
                ICL     EQU 15H

OCH     EQU 16H
                OCL     EQU 17H
40
                COUNTH  EQU 18H
                COUNTL  EQU 19H
```

```
                                        21

ALTH    EQU 1AH
        ALTL    EQU 1BH

CLKSTAT EQU 1CH
 5      CLKINTE EQU 1DH

PLL     EQU 24H

INTE    EQU 25H
10      INTSTAT EQU 26H

COP     EQU 27H
        ADATA   EQU 28H
        ADCONT  EQU 29H
15

;GGGGGGGGGGGGGGGGGGGGGGGGGGGGGGGG

;       RAM LABELS
20
        LARGE1  EQU 50H             ;largest key number,0-14
        LARGE2  EQU 51H
        KEY     EQU 52H             ;which key, 1-15
        KEYDEB  EQU 53H
25      READING EQU 54H
        NKYCNT  EQU 55H
        VMIN    EQU 56H
        MAX     EQU 57H
        SUB     EQU 58H
30      TOG     EQU 59H
        BEEPCNT EQU 5AH             ;total beep on/off
        SELECT  EQU 5BH    ;0:SET/CALDERA   CLR/GENERAL
        TEMPO1  EQU 5CH 35
        PACECNT EQU 5DH
        TEMPO   EQU 5EH
        KEYSTAT EQU 5FH    ;bit0=0:  no key | bit1: cop ok
        SCANFLAG EQU 60H   ;bit 0: scan completed
40      SCANCNT EQU 61H

;###############
        ; RAM EXCLUSIVELY FOR TOP ELEMENT CONTROL
```

22

```
        RLLEVEL   EQU 62H    ;LEVEL SETTING FOR REAR LEFT ELEMENT   0=OFF
        RRLEVEL   EQU 63H    ;LEVEL SETTING FOR REAR RIGHT ELEMENT  0=OFF
        FLLEVEL   EQU 64H    ;LEVEL SETTING FOR FRONT LEFT ELEMENT  0=OFF
        FRLEVEL   EQU 65H    ;LEVEL SETTING FOR FRONT RIGHT ELEMENT 0=OFF
 5      STATE     EQU 66H    ;0=RL ON,|1=RR ON|2=FL1 ON|3=FR1 ON|4=FL2 ON|
        ;                    ;5=KEY LOCK ON|6= FR2 ON|7= energized
        DIGSCN    EQU 67H    ;EACH BIT REPRESENTS DIGIT TO BE DISPLAYED NEXT ; DIG1 TO DIG8 BIT FOR BIT TRANSFER TO THE SEGMENT ADDRESSES
10      ; AND ARE USED ONLY FOR THE DISPLAY.

DIG1      EQU 68H    ;DISPLAY BUFFER FOR DIGIT1
        DIG2      EQU 69H    ;DISPLAY BUFFER FOR DIGIT2
        DIG3      EQU 6AH    ;DISPLAY BUFFER FOR DIGIT3
15      DIG4      EQU 6BH    ;DISPLAY BUFFER FOR DIGIT4
        DIG5      EQU 6CH    ;DISPLAY BUFFER FOR DIGIT5
        DIG1BUF   EQU 6DH
        DIG2BUF   EQU 6EH
        DIG3BUF   EQU 6FH
20      DIG4BUF   EQU 70H

BEEPTOG   EQU 71H    ;BIT 0 SET = BEEP | BIT 1 SET = DO NOT DISPLAY
                             ; BIT2 SET = DISPLAY DELAYED DUE TO BIT 1
        STATUS    EQU 72H    ;BIT:0=INIT MODE|1 KEYBOARD ERROR |2 CURRENT TEST
25      STARTED
                             ;3 key error missed 1st time  |5 int in progress|
                             ;6 temp to high flash 1/10|7= 10hr timer
                             ;enabled 30      KEYS      EQU 73H    ;for 2nd scanning
        SLO       EQU 74H    ;PASS COUNTER USED IN "LINES"
        DUNLIN    EQU 75H    ;BIT01=DIG1 DUN "LINES"|1=DIG2 DUN "LINES"|2=DIG3 DUN
        "LINES"|
                             ;3=DIG4 DUN "LINES"|4=DIG5 DUN "LINES"
35      BPCNT     EQU 76H    ; BEEPER COUNTER
        INTCOUNT  EQU 77H
        HALFTOG   EQU 78H    ;BIT0 IS TOGGLED EVERY 1/2 SEC
        COUNTINT  EQU 79H    ;INTERUPT COUNTER
        COUNTLOCK EQU 7AH    ;180 = 3 SECONDS
40      MAESTRO   EQU 7BH    ;BIT 0=CALL FOR LOCK/UNLOC BEEPS
        BEEP3     EQU 7CH    ;COUNTER FOR 3BEEPS
        RELEASE   EQU 7DH    ;bit0=1:key is sure
```

```
                                                23
        PROGRAM    EQU  7EH    ;BIT: 0=RL|1=RR|2=FL1|3=FR1|4=FL2|6=FR2   set for
        starting
        SCROLL     EQU  7FH    ;BIT: 0=RLUP|1=RLDWN|2=RRUP|3=RRDWN|4=FLUP|5=FLDWN
                               ;     6=FRUP|7=FRDWN]
5       SCRO       EQU  80H    ;SCROLL COUNTER
        AK         EQU  81H
        PROGOUT    EQU  82H    ;clear when key is pressed
        send       equ  83h
        LEVCOUNT   EQU  84H
10
        AMBT       EQU  85H
        AMBDB      equ  86h
        INICNT     equ  87h 15      beeptry    equ  88h
        keybuf     equ  89h
        nkeycnt    equ  8Ah
        CHOOSE     EQU  8BH    ;BIT: 0=RL|1=RR|2=FL|3=FR |4=    |6=
        MINUTE     EQU  8CH
20      PANIKCNT   EQU  8DH
        PANIKFLG   EQU  8EH
        RLBUF      EQU  8FH
        FLBUF      EQU  90H
        RRBUF      EQU  91H
25      FRBUF      EQU  92H
        STATEBUF   EQU  93H
        HALFMIN    EQU  94H
        LOCKHALF   EQU  95H
        PENDING    EQU  96H
30      KEYERR     EQU  97H
        ALASTOP    EQU  98H    ;0 TEMPERATURE HIGH  |1 KEYBOARD ERROR |2 INITIAL ALARM
        TIMER
        TSCANCNT   EQU  99H
        TSCANFLG   EQU  9AH
35      WHICH      EQU  9BH    ;BIT: 0=RL|1=RR|2=FL|3=FR1|4=FL2|6=FR2 FOR SELECT ;##############
        DIFF       EQU  9DH    ; 9D - 0AFH IS RESERVED
        NKEY       EQU  0B0H   ;0B0 - 0C2H IS RESERVED
40      VREAD      EQU  0C3H   ;0C3 - 0D5H IS RESERVED
        NKEYDEB    EQU  0D6H   ;0D6 - 0E8H IS RESERVED
```

24

```
        RRELAY      EQU 4   ;PORTD
        LRELAY      EQU 6   ;PORTD
        FL2RELAY    EQU 3   ;PORTE
        FAN         EQU 0   ;PORTB
5       FR2RELAY    EQU 1   ;PORTD

;FR2TRIAC   EQU 4
        RLTRIAC     EQU 0   ;PORTD
        FL1TRIAC    EQU 4   ;PORTE
10      RRTRIAC     EQU 5   ;PORTD
        FR1TRIAC    EQU 3   ;PORTD

KEYNUM    EQU 11T

15      CALDERA   EQU 01T    ;CALDERA KEY POSITION #
        FR1       EQU 02T
        FL1       EQU 03T
        FR2       EQU 04T
        FL2       EQU 05T
20      RR        EQU 06T
        RL        EQU 07T
        DOWN      EQU 08T
        UP        EQU 09T
        HIGH      EQU 10T
25      LOW       EQU 11T

LOCK      EQU 5
        T70C      EQU 47T   ;70 DEGREES C

30
;***********************************************************
;                                                           *
;       Initialization Routine                              *
;                                                           *
35 ;***********************************************************

INIT:
            BSET 7,PLL    ;SELECT PLL
            BSET 5,PLL
40          BSET 6,PLL    ;BUS RATE = 2.604 MHZ
            BRCLR 0;PLL,*  ;WAIT FOR STABILITY
            BSET 5,COP    ;IRQ EDGE ONLY
            bset 0,cop
```

```
                                        25
                LDA #00011000Q
                CLR PORTE
                STA DRE
                LDA #01111111Q
 5              CLR PORTD
                STA DRD
                lda #0FFH
                sta drc
                BCLR 3,DRC
10              CLR PORTC
        ;        CLR DRC         ;+
                LDA #10000001Q
                CLR PORTB
                sta drb
15              RSP
                LDA #00H
                LDX #0B0H
        CLR
                STA 4FH,X    ;clear 50H-FFH
20              DECX
                BNE CLR ; INITIALIZE KEY BUFFERS
25
                LDA #50T     ; FOR EMULATOR USE #16T
                STA SUB      ;SUB MUST ALWAYS BE > MIN
                LDA #93T     ; FOR EMULATOR USE #30T
                STA MAX
30

INITKEY:
                LDA #0FFH
                LDX #0H
35      INITKY:
                STA NKEY,X
                INCX
                CPX #KEYNUM     ;(0B0H - 0C2H) = #0ffH
                BCS INITKY
40              JSR FIXOUT      ;START OFF CORRECTLY WITH KEYBOARD

;!!!!!!!!!!!!!!!!!!!!!!!!!!!!!!!!!!!!!!!!!!!!!!!!!!!
                BRCLR 5,PORTB,GENERAL
```

```
                                            26
                BSET 0,SELECT
                BRA SEFIN
          GENERAL:
                BCLR 0,SELECT
  5       SEFIN:
                lda #100t
                sta ambt    ;real temp
                   sta ambdb ;assume safe temp to start, assumed temp: first new
          reading
 10
                CLR RTCMA
                LDA #0H
                STA RTCSA
                LDA #0AH    ;10 HOURS 0 MINUTES 0 SECONDS
 15             STA RTCHA

BSET 1,$1D  ;ENABLE ALARM INTERUPT

BSET 0,STATUS    ;SET INIT MODE
 20             BSET 6,TCR       ;SET UP BEEPER INTERUPT
                LDA #40H    ;START TIMER INTERUPT BEEPER, enable timer interrupt
                STA TCR ;**************************************************
 25       ;                                                 *
          ; Main Program                                    *
          ;                                                 *
          ;**************************************************
          MAIN
 30             CLI              ;enable hardware interrupt
                BSET 1,KEYSTAT   ; TELL COP IM OK
                LDA STATE
                AND #5FH
                BNE NACTIVE      ;SOMETHING IS ON SO LET TIME ADVANCE
 35             LDA #00H
                STA RTCH
                STA RTCM
                STA RTCS
                BSET 1,1DH       ;enable clock alarm interrupt
 40       NACTIVE:
                brset 1,status,kerr
                bclr 1,alastop
                bclr 2,alastop
```

27

```
         kerr:
                 JSR ANALOG        ;GET ANALOG READINGS
                 JSR TESTSCAN
                 JSR KEYSCAN
  5              JSR DISPRUT
                 JSR GOVERN
                 JSR KEYCHECK BRSET 0,STATE,LEFTON
 10              BRCLR 2,STATE,LEFTOFF
         LEFTON:
                 BSET LRELAY,PORTD
                 BRA LEFTLONE
         LEFTOFF:
 15              BCLR LRELAY,PORTD
         LEFTLONE:
                 BRSET 1,STATE,RITON
                 BRCLR 3,STATE,RITOFF
         RITON:
 20              BSET RRELAY,PORTD
                 BRA RITETLONE
         RITOFF:
                 BCLR RRELAY,PORTD 25      RITETLONE:
                 BRCLR 4,STATE,FL2OFF
                 BSET FL2RELAY,PORTE
                 BRA FL2LONE
         FL2OFF:
 30              BCLR FL2RELAY,PORTE
         FL2LONE:
                 BRCLR 6,STATE,FR2OFF
                 BSET FR2RELAY,PORTD
                 BRA FR2LONE
 35      FR2OFF:
                 BCLR FR2RELAY,PORTD
         FR2LONE:
                 LDA PACECNT ;lines dun for 4 elements
                 CMP #15T
 40              BCS FR2LONE
                 CLR PACECNT
                 JSR BLANK
                 JSR DISPLAY
```

28

```
              BRA MAIN

;***************************************************
       ;                                                   *
 5     ;  SHUT OFF IN CASE OF KEYBOARD ERROR               *
       ;                                                   *
       ;***************************************************
       KEYCHECK:
              BRSET 0,STATUS,NOERR
10            CLRX
       LOOP:
              LDA VREAD,X
              CMP #215T                ;4.2V
              BCC ERRCNT
15            CMP #7T                  ;0.13V
              BCC NEXTCHECK
       ERRCNT:
              INC KEYERR
              BRA FOUND
20     NEXTCHECK:
              incx
              CPX #KEYNUM
              BCC CHKDUN
              BRA LOOP
25     CHKDUN:
              CLR KEYERR
              BRA NOERR
       FOUND:
              LDA KEYERR
30            CMP #5T       ;DEBOUCING CHECK 5 TIMES
              BCS NOERR
              BSET 1,STATUS
              bclr 3,status
              BRSET 1,ALASTOP,TROUBLE
35            BSET 0,MAESTRO
              BRSET 2,ALASTOP,TROUBLE
              CLR HALFTOG
              BSET 2,ALASTOP
       TROUBLE:
40            CLR STATE
              CLR PROGRAM
              CLR WHICH
       NOERR:
```

```
                                    RTS

;**********************************************************************
        ;                                                                      *
5       ; GOVERN IS THE ROUTINE THAT RESPONDS TO DIFFERRENT KEY PRESSES        *
        ;                                                                      *
        ;**********************************************************************

LOCKED:
10             RTS
        GOVERN:
               BRSET 0,RELEASE,LOCKED
               LDA KEY
               CMP #CALDERA
15             BNE SEEFR2
               JMP LOCKPANIK

SEEFR2:
        ;      CMP #0FFH
20      ;      BEQ SEEM
               CLR COUNTLOCK       ;ITS NOT CALDERA KEY SO RESET THE 2 SECOND
        COUNTER
               brset 6,status,locked   ;temp too high so nothing is allowed
               BRSET 5,STATE,LOCKED
25
               CMP #FR2
               BNE SEEFL2
               JMP FR2PR
        SEEFL2:
30             CMP #FL2
               BNE SEERL
               JMP FL2PR
        SEERL:
               CMP #RL
35             BNE SEERR
               JMP RLPR
        SEERR:
               CMP #RR
               BNE SEEFL1
40             JMP RRPR
        SEEFL1:
               CMP #FL1
               BNE SEEFR1
```

```
                        30

JMP FL1PR
        SEEFR1:
                CMP #FR1
                BNE SEEUP
5               JMP FR1PR
        SEEUP:
                CMP #UP
                BNE SEEDWN
                JMP UPPR
10      SEEDWN:
                CMP #DOWN
                BNE SEEHIGH
                JMP DOWNPR
        SEEHIGH:
15              CMP #HIGH
                BNE SEELOW
                JMP HIGHPR
        SEELOW:
                CMP #LOW
20              BNE SEEM
                JMP LOWPR
        SEEM:
                RTS

25

; GETS HERE IF CALDERA KEY IS PRESSED
        LOCKPANIK:
                BRCLR 0,STATUS,READYOUT
30              BCLR 0,STATUS      ;GET OUT OF INIT MODE

CLR RLLEVEL
                CLR RRLEVEL
                CLR FLLEVEL
35              CLR FRLEVEL
                CLR STATE
        READYOUT:
                BRCLR 5,STATE,LOCKOUT

40              LDA HALFMIN
                CMP #60T           ;count 30 seconds
                BCC YPK0
                CMP #2T            ;;;
```

```
                                    31
              BCS CPK                       ;;;
              BRSET 0,PANIKFLG,YPK1
              LDA #1
              STA PANIKFLG
 5            CLR PANIKCNT
              BRA YPK3
      YPK1:
              BRCLR 1,PANIKFLG,ypk3      ;if 4 < panikcnt < 60,start up
              LDA PANIKCNT
10            CMP #4T
              BCS CPK
              CMP #60T
              BCC CPK
      YPK2:
15            LDA RLBUF
              STA RLLEVEL
              LDA RRBUF
              STA RRLEVEL
              LDA FLBUF
20            STA FLLEVEL
              LDA FRBUF
              STA FRLEVEL
              LDA STATEBUF
              STA STATE
25            LDA #80T
              STA HALFMIN
              CLR PENDING
              BSET 0,RELEASE
              CLR PANIKCNT
30            RTS CPK:
              CLR PANIKFLG
              CLR PANIKCNT
35            RTS
      YPK0:
              CLR RLBUF
              CLR RRBUF
              CLR FLBUF
40            CLR FRBUF
              CLR STATEBUF
              bset 5,statebuf    ;redundent,but safe
              LDA #80T
```

```
                    STA HALFMIN
                    CLR PENDING
       YPK3:

5                  LDA COUNTLOCK    ;lock/unlock, provided all elements off
                    CMP #120T
                    BCS LOCKOUT_
                    clr countlock
                    BCLR 5,STATE     ;ENABLE UNLOCK
10                  BSET 0,RELEASE
                    BSET 0,MAESTRO   ;CALL FOR LOCK/UNLOCK BEEPS
                    LDA #80T
                    STA HALFMIN
                    CLR PENDING
15
       LOCKOUT_:
                    RTS
       LOCKOUT:
                    BSET 0,RELEASE
20                  LDA RLLEVEL      ;SAVE
                    STA RLBUF
                    LDA RRLEVEL
                    STA RRBUF
                    LDA FLLEVEL
25                  STA FLBUF
                    LDA FRLEVEL
                    STA FRBUF
                    LDA STATE
                    STA STATEBUF
30                  CLR STATE
                    CLR PROGRAM
                    CLR WHICH
                    CLR CHOOSE
                    BSET 5,STATE     ;ENABLE LOCK
35                  CLR HALFMIN      ;START TO COUNT FOR UNDO
                    BSET 0,PENDING   ;
                    CLR PANIKFLG
                    LDA STATEBUF
                    AND #01011111Q
40                  BNE RRR
                    LDA #80T
                    STA HALFMIN      ;LOCK IMMEDIATELY
                    CLR PENDING
```

33

```
        RRR:
                RTS

; GETS HERE IF REARLEFT IS PRESSED
        RLPR:
                BCLR 0,STATUS      ;NO LONGER INIT MODE
                bset 0,beeptog    ;+b6
                BSET 0,RELEASE
                CLR CHOOSE
                BSET 0,CHOOSE
                BRSET 0,PROGRAM,CANRL
                BRCLR 0,STATE,RLJUSTON
                CLR PROGRAM
                CLR WHICH
                BSET 0,PROGRAM                  ;GET HERE IF NO PROGRAM & ELEMENT ON
        ;        BCLR 0,STATE
                RTS
        CANRL:
                CLR CHOOSE                      ;GET HERE IF PROGRAM
                BCLR 0,STATE
                CLR RLLEVEL
                CLR PROGRAM
                CLR WHICH
                RTS
        RLJUSTON:
                LDA #5T                         ;GET HERE IF NO PROGRAM & ELEMENT OFF
                STA RLLEVEL
                LDA #01H
                STA PROGRAM
                STA WHICH
                RTS
     ; GETS HERE IF REARRIGHT IS PRESSED
        RRPR:
                BCLR 0,STATUS      ;NO LONGER INIT MODE
                bset 0,beeptog    ;+b6
                BSET 0,RELEASE
                CLR CHOOSE
                BSET 1,CHOOSE
                BRSET 1,PROGRAM,CANRR
                BRCLR 1,STATE,RRJUSTON
```

34

```
                CLR PROGRAM
                CLR WHICH
                BSET 1,PROGRAM
                RTS
 5      CANRR:
                CLR CHOOSE
                BCLR 1,STATE
                CLR RRLEVEL
                CLR PROGRAM
10              CLR WHICH
                RTS
        RRJUSTON:
                LDA #5T
                STA RRLEVEL
15              LDA #02H
                STA PROGRAM
                STA WHICH
                RTS

20

;FRONT>>>>>>>>>>>>>>>>>>>>>>>>>>>>>>>>>>>>>>>>>>>>>>>

; GETS HERE IF FRONTLEFT IS PRESSED
25      FL1PR:
                BCLR 0,STATUS      ;NO LONGER INIT MODE
                bset 0,beeptog     ;+b6
                BSET 0,RELEASE
                CLR CHOOSE
30              BSET 2,CHOOSE
                BRCLR 4,STATE,FL11
                BCLR 4,STATE            ;GET HERE IF FL DUAL IS ON
                BSET 2,STATE
                CLR PROGRAM
35              CLR WHICH
                BSET 2,PROGRAM
                RTS
        FL11:
                BRSET 2,PROGRAM,CANFL1
40              BRCLR 2,STATE,FL1JUSTON
                CLR PROGRAM
                CLR WHICH
                BSET 2,PROGRAM          ;GET HERE IF SINGLE IS ON & DUAL IS OFF
```

```
                                        35
                RTS
        CANFL1:
                CLR CHOOSE              ;GET HERE IF FL SINGLE IS PROGRAMMING &
        DUAL OFF
 5              BCLR 2,STATE
                CLR FLLEVEL
                CLR PROGRAM
                CLR WHICH
                RTS
10      FL1JUSTON:
        ;       BRSET 4,PROGRAM,FL12
                LDA #5T                 ;GET HERE IF SINGLE IS NOT PROGRAMMING &
        DUAL,SINGLE ARE OFF
                STA FLLEVEL
15              LDA #04H
                STA WHICH
        ;FL12:
                LDA #04H
                STA PROGRAM
20              RTS

; GETS HERE IF FRONTRIGHT IS PRESSED
        FR1PR:
                BCLR 0,STATUS    ;NO LONGER INIT MODE
25              bset 0,beeptog   ;+b6
                BSET 0,RELEASE
                CLR CHOOSE
                BSET 3,CHOOSE
                BRCLR 6,STATE,FR11
30              BCLR 6,STATE
                BSET 3,STATE
                CLR PROGRAM
                CLR WHICH
                BSET 3,PROGRAM
35              RTS
        FR11:
                BRSET 3,PROGRAM,CANFR1
                BRCLR 3,STATE,FR1JUSTON
                CLR PROGRAM
40              CLR WHICH
                BSET 3,PROGRAM
                RTS
        CANFR1:
```

36

```
                CLR CHOOSE
                BCLR 3,STATE
                CLR FRLEVEL
                CLR PROGRAM
5               CLR WHICH
                RTS
        FR1JUSTON:
        ;       BRSET 6,PROGRAM,FR12
                LDA #5T
10              STA FRLEVEL
                LDA #08H
                STA WHICH
        ;FR12:
                LDA #08H
15              STA PROGRAM
                RTS

; GETS HERE IF FL2 IS PRESSED
        FL2PR:
20              BCLR 0,STATUS    ;NO LONGER INIT MODE
                bset 0,beeptog   ;+b6
                BSET 0,RELEASE
                CLR CHOOSE
                BSET 4,CHOOSE
25              BRCLR 2,STATE,FL00
                BRSET 4,STATE,FL00
                BSET 4,STATE
                CLR PROGRAM              ;GET HERE IF SINGLE ON & DUAL OFF
                CLR WHICH
30              BSET 4,PROGRAM
                RTS
        FL00:
                BRSET 4,PROGRAM,CANFL2
                BRCLR 4,STATE,FL2JUSTON
35              CLR PROGRAM
                CLR WHICH
                BSET 4,PROGRAM           ;GETS HERE IF DUAL IS ON
                RTS
        CANFL2:
40              CLR CHOOSE
                BCLR 4,STATE             ;GET HERE IF DUAL IS
        PROGRAMMING
                BCLR 2,STATE
```

37

```
                CLR FLLEVEL
                CLR PROGRAM
                CLR WHICH
                RTS
 5      FL2JUSTON:
                BRSET 2,STATE,FL21
                LDA #5T                         ;GET HERE IF NO PROGRAMMING &
        DUAL IS OFF
                STA FLLEVEL
10              LDA #10H
                STA WHICH
        FL21:
                LDA #10H
                STA PROGRAM
15              RTS
        ; GETS HERE IF FR2 IS PRESSED
        FR2PR:
                BCLR 0,STATUS     ;NO LONGER INIT MODE
                bset 0,beeptog    ;+b6
20              BSET 0,RELEASE
                CLR CHOOSE
                BSET 6,CHOOSE
                BRCLR 3,STATE,FR00
                BRSET 6,STATE,FR00
25              BSET 6,STATE
                CLR PROGRAM
                CLR WHICH
                BSET 6,PROGRAM
                RTS
30      FR00:
                BRSET 6,PROGRAM,CANFR2
                BRCLR 6,STATE,FR2JUSTON
                CLR PROGRAM
                CLR WHICH
35              BSET 6,PROGRAM                  ;GETS HERE BECAUSE IT WAS
        JUST TURNED OFF
                RTS
        CANFR2:
                CLR CHOOSE
40              BCLR 6,STATE
                BCLR 3,STATE
                CLR FRLEVEL
                CLR PROGRAM
```

38

```
                CLR WHICH
                RTS
        FR2JUSTON:
                BRSET 3,STATE,FR21
 5              LDA #5T
                STA FRLEVEL
                LDA #40H
                STA WHICH
        FR21:
10              LDA #40H
                STA PROGRAM
                RTS
        ;GETS HERE IF  UP IS PRESSED
        UPPR:
15              bset 0,beeptog
                BSET 0,RELEASE
                lda #196t      ;WAIT 1 SECOND AFTER INITIAL SCROLL
                sta scro
                BRCLR 0,CHOOSE,UP1
20              BSET 0,STATE
                CLR WHICH
                LDA RLLEVEL
                CMP #11T
                BCC NOT0
25              INC RLLEVEL
        NOT0:
                LDA #01H
                STA SCROLL
                RTS
30      UP1:
                BRCLR 1,CHOOSE,UP2
                BSET 1,STATE
                CLR WHICH
                LDA RRLEVEL
35              CMP #11T
                BCC NOT1
                INC RRLEVEL
        NOT1:
                LDA #04H
40              STA SCROLL
                RTS
        UP2:
                BRCLR 2,CHOOSE,UP3
```

```
                            BSET 2,STATE
                            CLR WHICH
                            LDA FLLEVEL
                            CMP #11T
      5                     BCC NOT2
                            INC FLLEVEL
                    NOT2:
                            LDA #10H
                            STA SCROLL
     10                     RTS
                    UP3:
                            BRCLR 3,CHOOSE,UP4
                            BSET 3,STATE
                            CLR WHICH
     15                     LDA FRLEVEL
                            CMP #11T
                            BCC NOT3
                            INC FRLEVEL
                    NOT3:
     20                     LDA #40H
                            STA SCROLL
                            RTS
                    UP4:
                            BRCLR 4,CHOOSE,UP5
     25                     BSET 4,STATE
                            BSET 2,STATE
                            CLR WHICH
                            LDA FLLEVEL
                            CMP #11T
     30                     BCC NOT4
                            INC FLLEVEL
                    NOT4:
                            LDA #10H
                            STA SCROLL
     35                     RTS
                    UP5:
                            BRCLR 6,CHOOSE,UP6
                            BSET 6,STATE
                            BSET 3,STATE
     40                     CLR WHICH
                            LDA FRLEVEL
                            CMP #11T
                            BCC NOT5
```

```
                        INC FRLEVEL
        NOT5:
                        LDA #40H
                        STA SCROLL
        UP6:
                        RTS

;GETS HERE IF CENTER DOWN IS PRESSED
        DOWNPR:
                        bset 0,beeptog
                        BSET 0,RELEASE
                        lda #196t      ;WAIT 1 SECOND AFTER INITIAL SCROLL
                        sta scro
                        BRCLR 0,CHOOSE,DOWN1
                        BSET 0,STATE
                        CLR WHICH
                        LDA RLLEVEL
        NOT5A:
                        CMP #2T
                        BCS NOT6
                        DEC RLLEVEL
        NOT6:
                        LDA #02H
                        STA SCROLL
                        RTS
        DOWN1:
                        BRCLR 1,CHOOSE,DOWN2
                        BSET 1,STATE
                        CLR WHICH
                        LDA RRLEVEL
        NOT6A:
                        CMP #2T
                        BCS NOT7
                        DEC RRLEVEL
        NOT7:
                        LDA #08H
                        STA SCROLL
                        RTS
        DOWN2:

BRCLR 2,CHOOSE,DOWN3
```

41

```
                BSET 2,STATE
                CLR WHICH
                LDA FLLEVEL
        NOT7A:
 5              CMP #2T
                BCS NOT8
                DEC FLLEVEL
        NOT8:
                LDA #20H
10              STA SCROLL
                RTS
        DOWN3:
                BRCLR 3,CHOOSE,DOWN4
                BSET 3,STATE
15              CLR WHICH
                LDA FRLEVEL
        NOT8A:
                CMP #2T
                BCS NOT9
20              DEC FRLEVEL
        NOT9:
                LDA #80H
                STA SCROLL
                RTS
25      DOWN4:
                BRCLR 4,CHOOSE,DOWN5
                BSET 4,STATE
                BSET 2,STATE
                CLR WHICH
30              LDA FLLEVEL
        NOT9A:
                CMP #2T
                BCS NOT10
                DEC FLLEVEL
35      NOT10:
                LDA #20H
                STA SCROLL
                RTS
        DOWN5:
40              BRCLR 6,CHOOSE,DOWN6
                BSET 6,STATE
                BSET 3,STATE
                CLR WHICH
```

```
                                42
              LDA FRLEVEL
       NOT10A:
              CMP #2T
              BCS NOT11
              DEC FRLEVEL
       NOT11:
              LDA #80H
              STA SCROLL
       DOWN6:
              RTS
       ;*****************************************
       HIGHPR:
              bset 0,beeptog
              BSET 0,RELEASE
              BRCLR 0,CHOOSE,HIGH1
              BSET 0,STATE
              CLR WHICH
              LDA #11T
              STA RLLEVEL
              RTS
       HIGH1:
              BRCLR 1,CHOOSE,HIGH2
              BSET 1,STATE
              CLR WHICH
              LDA #11T
              STA RRLEVEL
              RTS
       HIGH2:
              BRCLR 2,CHOOSE,HIGH3
              BSET 2,STATE
              CLR WHICH
              LDA #11T
              STA FLLEVEL
              RTS
       HIGH3:
              BRCLR 3,CHOOSE,HIGH4
              BSET 3,STATE
              CLR WHICH
              LDA #11T
              STA FRLEVEL
              RTS
       HIGH4:
              BRCLR 4,CHOOSE,HIGH5
```

43

```
                BSET 4,STATE
                BSET 2,STATE
                CLR WHICH
                LDA #11T
 5              STA FLLEVEL
                RTS
        HIGH5:
                BRCLR 6,CHOOSE,HIGH6
                BSET 6,STATE
10              BSET 3,STATE
                CLR WHICH
                LDA #11T
                STA FRLEVEL
        HIGH6:
15              RTS

LOWPR:
                bset 0,beeptog
                BSET 0,RELEASE
20              BRCLR 0,CHOOSE,LOW1
                BSET 0,STATE
                CLR WHICH
                LDA #1T
                STA RLLEVEL
25              RTS
        LOW1:
                BRCLR 1,CHOOSE,LOW2
                BSET 1,STATE
                CLR WHICH
30              LDA #1T
                STA RRLEVEL
                RTS
        LOW2:
                BRCLR 2,CHOOSE,LOW3
35              BSET 2,STATE
                CLR WHICH
                LDA #1T
                STA FLLEVEL
                RTS
40      LOW3:
                BRCLR 3,CHOOSE,LOW4
                BSET 3,STATE
                CLR WHICH
```

44

```
                LDA #1T
                STA FRLEVEL
                RTS
        LOW4:
                BRCLR 4,CHOOSE,LOW5
                BSET 4,STATE
                BSET 2,STATE
                CLR WHICH
                LDA #1T
                STA FLLEVEL
                RTS
        LOW5:
                BRCLR 6,CHOOSE,LOW6
                BSET 6,STATE
                BSET 3,STATE
                CLR WHICH
                LDA #1T
                STA FRLEVEL
        LOW6:
                RTS

;*************************************************************************
***
        ;
        *
        ;       BEEPER IS THE TIMER OUTPUT COMPARE INTERUPT
        *
        ;       SERVICE ROUTINE.
        *
        ;          INTERMNAL BUS = 2.622MHZ
        *
        ;          =381.388 nSECS
        *
        ;          TIMER COUNT = 1.525553 uSECS
        *
        ;          GETS HERE EVERY OCH|OCL * 11.52553 uSEC = 89T*1.5255uS =
        *
        ;                          135.77uS
        *
        ;          40 uSEC < DURATION >90 uSEC
        *
```

45

```
        ;
        *
        ;**********************************************************************
        ***
 5   BEEPER:
            BRCLR 0,BEEPTOG,NBP      ;ARE WE BEEPING?
            LDA #01H
            EOR TCR
            STA TCR                  ;toggle TCMP output level
10          BRA BEEPON
     NBP
            Bclr 0,TCR               ;beeper off BEEPON:
15          LDA #89T
            ADD OCL  ; BEEPER = OCL * 1.525553 uSECS = 136u
            STA TEMPO1 ; THEREFORE BEEPER FREQ = 1/[2*89*1.525553uSEC]=3.811 KHZ
            LDA #00H
            ADC OCH
20          STA OCH
            LDA TEMPO1
            STA OCL
            LDA TSR
            LDA OCL
25
            BRCLR 1,KEYSTAT,COPTOUT
            CLRA
            STA 3FF0H                ;prevent cop time-out, p4-10
            BCLR 1,KEYSTAT
30   COPTOUT:
     ; gets here every @136 uSECS
            INC PACECNT
            INC BEEPCNT
            lda BEEPCNT              ;4 times per beep
35   ;      CMP #4T    ;@ 1.0 MSECS = 7T
            CMP #7T    ;+*
            BCS NOREQ_1
            CLR BEEPCNT 40   ; GETS HERE EVERY @1 MSECS
            INC INTCOUNT             ;turn off triacs based on freq. from HZ
            LDA INTCOUNT
            CMP #12T    ;+*
```

46

```
;       CMP #27T
        BNE NOT_OFF

BCLR RLTRIAC,PORTD
5       BCLR FL1TRIAC,PORTE
        BCLR RRTRIAC,PORTD
        BCLR FR1TRIAC,PORTD

NOT_OFF:
10      BRCLR 0,BEEPTOG,NOCOUNT
        INC BPCNT
        inc beeptry
        lda beeptry
        cmp #070h
15      BNE NOCOUNT
                BCLR    0,BEEPTOG    ;STOP THE BEEP  ,   one beep is
   4*FF(beepcnt*bpcnt)times
        clr beeptry
   NOCOUNT:
20

; VKEYS IS THE SCAN ROUTINE THAT GETS THE READING FOR EACH KEY
   ; IN THE SYSTEM.IT DOES ONE KEY PER PASS.
   ; TO SCAN 18 KEYS TAKES 10 MSECS FOR ONE PASS.
25
   VKEYS:
        BRSET 0,SCANFLAG,NOREQ_1
   NOFAKE:
        LDX SCANCNT
30      BSET 2,DRD
        BCLR 2,PORTD       ;send pulse
        LDA #22H
        STA ADCONT         ;choose AN2 port, A/D enabled
   ADLOOP:
35      BRCLR 7,ADCONT,ADLOOP
        LDA ADATA     ; READING TAKES ABOUT 12 uSECS
        STA READING
        BSET 2,PORTD       ;remove pulse 40      LDA SCANCNT
        CMP #0FFH
        BNE SAFE1ST
        INC SCANCNT   ;SET READING TO 0
```

47

```
            LDA #0FFH
            CLR PORTC
            STA DRC
            BCLR 3,DRC
 5          LDA #0FEH
            CLR PORTA
            CLR PORTC
            STA DRA
        ;       CLR DRC         ;+
10      ;       LDA #01H        ;+
        ;       STA DRA         ;+
        ;       LDA #0FFH       ;+
        ;       STA PORTA       ;+
        ;       STA PORTC       ;+
15      NOREQ_1
            BRA NOREQ       ;1ST READING ALWAYS FALSE
        SAFE1ST:
            LDA READING
            STA VREAD,X
20
            INC SCANCNT
            LDX SCANCNT
            CPX #8H
            BCC P2DUN
25          SEC     ;REDUNDANDANT BUT SAFE
        ;       CLC                     ;+
            ROL DRA                     ;scan the next key
            CLR PORTA
        ;       LDA #0FFH       ;+
30      ;       STA PORTA       ;+
            BRA NOREQ
        P2DUN:
            CPX #16T
            BCC ALLDUN
35          LDA #0FFH
            STA DRA
            CLR PORTA
        ;       CLR DRA         ;+
        ;       LDA #0FFH       ;+
40      ;       STA PORTA       ;+
            CPX #8T
            BNE ROLON
            LDA #0FEH
```

48

```
                STA DRC
                BCLR 3,DRC
                CLR PORTC      ;REDUNDANT
        ;       LDA #01H       ;+
5       ;       STA DRC        ;+
        ;       LDA #0FFH      ;+
        ;       STA PORTC      ;+
                BRA NOREQ
        ROLON:
10              SEC
        ;       CLC            ;+
                ROL DRC
                BCLR 3,DRC     ;SINCE PC3 IS TIRED TO VCC,CONFIG IT AS INPUT
                CLR PORTC
15      ;       LDA #0FFH      ;+
        ;       STA PORTC      ;+
                BRA NOREQ
        ALLDUN:
                LDA #0FFH
20              STA DRC
                BCLR 3,DRC
                CLR PORTC
        ;       CLR DRC        ;+
        ;       LDA #0FFH      ;+
25      ;       STA PORTC      ;+
                BSET 0,SCANFLAG  ;SCAN COMPLETE
                CLR TSCANCNT   ;;;;
                CLR TSCANFLG   ;;;;
        NOREQ:
30      RET:
                RTI

TESTSCAN:
35              BRSET 0,STATUS,GOOUT
                BRSET 0,SCANFLAG,TEST1  ;TEST ONLY IF SCAN COMPLETE
        GOOUT:
                RTS
        GOOOO:
40              BCLR 2,STATUS           ;ready to test
                BRA GOOUT
        TEST1:
                BRCLR 2,HALFTOG,GOOOO
```

49

```
                BRSET 2,STATUS,GOOUT
                BSET 2,STATUS
        TEST1AAA:
                TST TSCANCNT
 5              BNE TEST2A
                brclr 3,status,test1b      ;start to test
                BCLR 1,STATUS              ;GET HERE TO CHECK IF IT PASSES THE 2ND
    NO-ERROR TEST
    test1b:
10              LDA #0FFH
                STA DRA
                LDA #07H
                STA DRC
                CLR PORTC
15              CLR PORTA
                CLR TSCANFLG
                SEC
                BRA TEST2
        TEST2A:
20              CLC
        TEST2:
                ROL TSCANFLG
                INC TSCANCNT
                LDA TSCANCNT
25              CMP #9T
                BCS TEST3
                BNE TEST3A
                LDA #1T
                STA TSCANFLG
30              BRA TEST4
        TEST3A:
                CMP #{KEYNUM+1}
                BCS TEST4
                brset 3,status,test3aa
35              bset 3,status
        test3aa:
                BRA TESTOVER
        TEST3:
                LDA #0FFH          ;1<= TSCANCNT <=8
40              STA DRA
                LDA #07H
                STA DRC
                CLR PORTC
```

```
                                        50
            LDA  TSCANFLG
            STA  PORTA
            BRA  TEST
    TEST4:                      ;9<= TSCANCNT <= #KEYNUM
            LDA  #0FFH
            STA  DRA
            LDA  #07H
            STA  DRC
            CLR  PORTA
            LDA  TSCANFLG
            STA  PORTC
    TEST:
            LDA  #22H
            STA  ADCONT         ;choose AN2 port, A/D enabled
            BRCLR 7,ADCONT,*
            LDA  ADATA     ; READING TAKES ABOUT 12 uSECS
            CMP  #200T
            BCC  TESTOUT
            CLR  PROGRAM
            CLR  WHICH
            CLR  STATE
            BSET 1,STATUS
            bclr 3,status
            BRSET 1,ALASTOP,TESTOVER
            BSET 0,MAESTRO
            BRSET 2,ALASTOP,TESTOVER
            CLR  HALFTOG
            BSET 2,ALASTOP
            BRA  TESTOVER
    TESTOUT:
            JMP  TEST1AAA
    TESTOVER:
            CLR  TSCANCNT
            CLR  TSCANFLG
            RTS ;*****************************************************
    ;                                                    *
    ; THIS SUBROUTINE TAKE @ 1.2 MSECS MAX               *
    ;                                                    *
    ;*****************************************************
```

51

```
        KEYSCAN:
                CLRX
        PURETOUCH:

5               BRSET 0,SCANFLAG,ANALYS   ;ANALYS ONLY IF SCAN COMPLETE
                RTS
        ;@@@@@@@@@@@@@@@@@@@@@@@@@@@@@@@@@@@@@@@@@@@@@@
        ANALYS:

10              JSR GETMIN      ;GO GET MIN LEVEL WITH ADJUSTMENTS

LDA VREAD,X
                STA READING
                CMP NKEY,X
15              BCC NEWDIF      ;IS IT LARGER THAN NKEY READING
        ; ADDED THIS PART TO PREVENT NOISE FROM CAUSING WRONG NO KEY LEVEL
        ;!!!!!!!!!!!!!!!!!!!!!!!!!!!!!!!!!!!!!!!!!!!!!!!!!
                CMP NKEYDEB,X
                BCS FLIP_IT     ;READING < OLD NKEYDEB?
20              SUB NKEYDEB,X
                BRA CHK_IT
        FLIP_IT:
                LDA NKEYDEB,X
                SUB READING
25      CHK_IT:
                BEQ TAKE_IT
                LDA READING
                STA NKEYDEB,X
                BRA NEXTKEY
30      TAKE_IT:
                LDA READING
                STA NKEYDEB,X
                STA NKEY,X      ; GETS HERE MEANS ITS LOWER
                BRA NEXTKEY
35
        NEWDIF:
                SUB NKEY,X
                STA DIFF,X
                CMP VMIN
40              BCS NEXTKEY     ;DIFFERENCE > 10T ?
                LDA DIFF,X

CMP MAX         ;#30T, if diff>max, reading-sub ->NKEY
```

```
                BCS NEXTKEY   ;
                LDA READING
                SUB SUB          ;#20T
                STA NKEY,X
 5      NEXTKEY:
                incx
                CPX #KEYNUM
                BCC  VP2DUN
                BRA ANALYS
10      VP2DUN:

CLRX

15      NKYTEST:
                LDA DIFF,X
                CMP VMIN       ;IFF ALL ARE LESS THAN MIN THEN NOKEY
                BCC LARGEST
                INCX
 20             CPX #KEYNUM
                BCS NKYTEST
                LDA #00
                STA KEY
                JMP LVKYLONE
 25     LARGEST:
                LDX #01H

LDA #00
                STA LARGE1
 30             LDA DIFF
        LARGETST:
                CMP DIFF,X
                BCC ONEUP
                STX LARGE1
 35             LDA DIFF,X
        ONEUP:
                INCX
                CPX #KEYNUM    ;LAST KEY?
                BCS  LARGETST
 40
        ; NOW GET THE SECOND LARGEST nperrr:
```

53

```
              LDA LARGE1
              BNE NOT_KEY1     ;if large1 is 1st key, assume large2 is 2nd key
              lda #01h
              sta large2
              ldx #01h
              lda diff,x
              ldx #02h
              BRA LARGEST2
       NOT_KEY1:

LDX #01H
              LDA #00H
              STA LARGE2
              LDA DIFF
       LARGEST2:
              CMP DIFF,X
              BCC ONEUP2
              LDA LARGE1
              BNE NOTSP
              CPX #0
              BNE NOTSP
              INCX         ;0 NOT ALLOWED AS SECOND LARGEST IF 1ST IS 0

NOTSP:
              CPX LARGE1
              BEQ ONEUP2
              STX LARGE2
              LDA DIFF,X
       ONEUP2:
              INCX
              CPX #KEYNUM    ;LAST KEY?
              BCS  LARGEST2

; RESULTANT KEY MAY NOW BE CHOSEN
       ;@@@@@@@@@@@@@@@@@@@@@@@@@@@@@@@@
       CHO:
              LDX LARGE2
              LDA DIFF,X
              CMP VMIN
               BCS ONEPRESS
              BRA SCRAPIT
       ;@@@@@@@@@@@@@@@@@@@@@@@@@@@@@@@@
       ONEPRESS:            ;one press or no key
```

54

```
            LDA LARGE1
            STA KEYbuf
            INC KEYbuf
        LVKYLONE:
5           LDA KEYbuf
            CMP KEYDEB
            BEQ GOODY
            ; NEW KEY
            STA KEYDEB
10      NDBD:
            clr keys
            CLR KEYbuf
            jmp FIXOUT
        scrapit:
15          bra fixlock
        GOODY:
            inc keys
            lda keys
            cmp #4t
20          bcc goody1
            clr keybuf
            bra fixout goody1:
25          clr keys
            LDA KEYbuf
            sta key
            BNE NOTRLSD
            BCLR 0,KEYSTAT
30          BCLR 0,RELEASE
            brclr 0,panikflg,goody2
            bset 1,panikflg
            bra goody3
        goody2:
35          CLR PANIKFLG
        goody3:
            CLR SCROLL
            BRA FIXOUT
        NOTRLSD:
40          CLR PROGOUT
            ; RESULT CAN BE FOUNT HERE
            BRSET 0,KEYSTAT,ACCENT
            BSET 0,KEYSTAT
```

```
                                            55
                brset 5,state.accent    ;do not beep if keyboard is locked
                LDA #00H
                STA RTCH
                STA RTCM
 5              STA RTCS
                BSET 1,1DH              ;real time clock alarm interrupt enable
                BSET 0,BEEPTOG          ;set beep
       ACCENT:          ;MAKE ALL OTHER KEYS DIFF = 0
                LDA KEY
10              CMP #0FFH
                BEQ FIXOUT
                CPX LARGE1
                BEQ SKIPP 15              LDA VREAD,X
                STA NKEY,X
                LDA #00H
                STA DIFF,X
       SKIPP:
20              INCX
                CPX #KEYNUM
                BCS ACCENT
                BRA FIXOUT
       FIXLOCK:
25              BCLR 0,KEYSTAT
                LDX #0FFH
       LOOPF:
                INCX
                LDA #0FFH
30              STA NKEY,X
                LDA #00H
                STA DIFF,X
                STA KEY
       SKIPTHIS:
35              CPX #{KEYNUM-1}
                BCS LOOPF
       FIXOUT:
                LDA #07FH       ;FIRST READING WILL BEDISCRARDED
                STA DRA
40              CLR PORTA
            ;   LDA #80H        ;+
            ;   STA DRA         ;+
            ;   LDA #0FFH       ;+
```

56

```
;         STA  PORTA        ;+
          CLR  SCANCNT
          DEC  SCANCNT       ;INITIALIZE KEY0 BY PUTTING FF
          BCLR 0,SCANFLAG   ;START NEW SCAN
          RTS

;*****************************************
;                                        *
;   Get sensitivity level                *
;                                        *
;*****************************************
GETMIN:
          lda  portB
          and  #00011110Q
;         lsla
;         lsla
          add  #4t          ;(portB *4) + 4t = vmin STA  VMIN
          ADD  #20T
          STA  SUB
          ADD  #20T
          STA  MAX
          RTS ;***************************************************************************
******
;
   *
; display is a subroutine called periodically to display the 8
   *
; digits. it is called from within the timer interupt. the first digit in the *
; sequence is dig1 PE0,then dig2 is displayed and so-on.
   *
;
   *
; each digit on time will be around 1.5 usecs not exceeding 1.7 usecs.
   *
; for a refresh rate in the region of 100 hz.
   *
```

57

```
; THE ROUTINE IS CALLED FROM WITHIN THE MAIN LOOP SO THE TIMEING IS NOT
FIXED *
; AND MAY DEPEND SOMEWHAT ON THE TIMEING OF BOTH INTERNAL AND EXTERNAL
   *
; INTERUPTS.
   *
;
   *
;******************************************************************
*****

DISPLAY:
                BSET FL1TRIAC,DRE
                BSET FR1TRIAC,DRD
                BSET RLTRIAC,DRD
                BSET RRTRIAC,DRD
                BSET LRELAY,DRD
                BSET RRELAY,DRD
                BSET FR2RELAY,DRD
                BSET FL2RELAY,DRE
                lda #10000001Q
                STA DRB    ;PORTB IS OUTPUT ;REDUNDANT BUT SAFE
                LDA DIGSCN
                BNE NOTRST   ;IF PASSED 4TH DIGIT THEN START OVER
RESETDIG:
                LDA #01H   ;RESET TO DIGIT 1
                STA DIGSCN
        NOTRST:
                BRCLR 0,DIGSCN,SEEDIG2
                LDA DIG1
                STA send   ;
        SEEDIG2:
                BRCLR 1,DIGSCN,SEEDIG3
                LDA DIG2
                STA send   ;
        SEEDIG3:
                BRCLR 2,DIGSCN,SEEDIG4
                LDA DIG3
                STA send   ;
        SEEDIG4:
                BRCLR 3,DIGSCN,SEEDIG5
                LDA DIG4
                STA send   ;
```

58

```
          SEEDIG5:
                          BRCLR 4,DIGSCN,NODIG6
                          LDA DIG5
                          STA send
     5    NODIG6:

DISPOUT:
          ; FOLLOWING TAKES 42 uSECS
    10
                          BCLR 7,PORTB
                          lda #50h
                            sta 2ah        ;serial peripheral output enable, master
                device
    15                    lda 2ch
                          lda 2bh lda SEND
                          sta 2ch          ;put send to I/Oregister
    20                      BRCLR 7,2BH,*  ;wait till completion of data transfer to
                serial LDA DIGSCN
    25                    STA 2CH
                          BRCLR 7,2BH,*    ;wait till transfer complete

BSET 7,PORTB

30                    CLC
                          ROL DIGSCN
                          LDA DIGSCN
                          CMP #00100000Q
                          BCS DIS1
    35                    CLR DIGSCN

DIS1:
                          RTS

40    BLANK:
                          BCLR 7,PORTB
                          lda #50h
                          sta 2ah
```

```
                                    59
                        lda 2ch
                        lda 2bh 5                      CLR 2ch         ;clear I/O register
                        BRCLR 7,2BH,*

CLR 2CH
10                      BRCLR 7,2BH,*
                        BSET 7,PORTB
                        RTS

;**************************************************************************
15  ;                                                                         *
    ; DISPRUT GETS THE INFORMATION REQUIRED TO SET UP DIG1 THRU DIG5 FOR THE  *
    ; DISPLAY ROUTINE.                                                         *
    ;                                                                         *
    ;**************************************************************************
20
    DISPRUT:
                BRCLR 6,STATUS,NOTINIT0
                JMP alarm
        NOTINIT0:
25              BRCLR 1,STATUS,NOTINIT1
                JMP ALARM
        NOTINIT1:
                LDA HALFTOG
                CMP #6T
30              BCS NOTINIT2
                BCLR 0,STATUS    ;END INIT MODE
        NOTINIT2:
                BRCLR 0,STATUS,NOTINIT
                LDA #9T          ;if in initial
35              STA RRLEVEL
                STA RLLEVEL
                STA FLLEVEL
                STA FRLEVEL
                LDA #7T
40              STA DIG5
                JMP LVDUN
        NOTINIT:
```

```
                            60
                 LDA PROGRAM      ;if both program and state off, clear element
        level
                 ORA STATE
                 STA AK
   5             BRSET 0,AK,SRRLV
                 CLR RLLEVEL SRRLV:
                 BRSET 1,AK,SFLLV
  10             CLR RRLEVEL
        SFLLV:
                 BRSET 2,AK,SFRLV
                 BRSET 4,AK,SFRLV
                 CLR FLLEVEL
  15    SFRLV:
                 BRSET 3,AK,T0
                 BRSET 6,AK,T0
                 CLR FRLEVEL
        T0:
  20             CLR DIG5
                 BRSET 5,STATE,T1    ;CALDERA LIGHT ON WHEN UNLOCK
                 BSET 2,DIG5
        T1:
                 BRCLR 4,STATE,T2
  25             BSET 1,DIG5
        T2:
                 BRCLR 6,STATE,T3
                 BSET 0,DIG5
        T3:
  30             BRCLR 4,PROGRAM,T4
                 BSET 1,DIG5
        T4:
                 BRCLR 6,PROGRAM,LVDUN
                 BSET 0,DIG5
  35    LVDUN:

RLESS
                 LDX RLLEVEL
                 LDA DISPTAB,X
  40             STA DIG1BUF
        RRESS:
                 LDX RRLEVEL
                 LDA DISPTAB,X
```

```
                       61
            STA DIG2BUF
    FLESS:
            LDX FLLEVEL
            LDA DISPTAB,X
 5          STA DIG3BUF
    FRESS:
            LDX FRLEVEL
            LDA DISPTAB,X
            STA DIG4BUF
10
            BRCLR 0,STATUS,ESSDUN
            BSET 7,DIG1BUF
            BSET 7,DIG2BUF
            BSET 7,DIG3BUF
15          BSET 7,DIG4BUF
    ESSDUN:
            BRCLR 0,HALFTOG,OUTOUT in:
20          BRCLR 0,STATUS,FLS1
            CLR DIG1BUF
            CLR DIG2BUF
            CLR DIG3BUF
            CLR DIG4BUF
25          CLR DIG5
            BRA OUTOUT
    FLS1:
            BRCLR 0,PROGRAM,FLS2
            BRCLR 0,WHICH,FLS1A
30          CLR DIG1BUF
            BRA FLS2
    FLS1A:
            BSET 7,DIG1BUF
    FLS2:
35              BRCLR 1,PROGRAM,FLS3     ;flash when halftog bit0=1 and
    program on
            BRCLR 1,WHICH,FLS2A
            CLR DIG2BUF
            BRA FLS3
40  FLS2A:
            BSET 7,DIG2BUF
    FLS3:
            BRCLR 2,PROGRAM,FLS3A
```

62

```
                BRCLR 2,WHICH,FLS3AA
                CLR DIG3BUF
                BRA FLS3A
    FLS3AA:
                BSET 7,DIG3BUF
    FLS3A:
                BRCLR 4,PROGRAM,FLS4
                BRCLR 4,WHICH,FLS3AAA
                CLR DIG3BUF
                BRA FLS4
    FLS3AAA:
                BSET 7,DIG3BUF
    FLS4:
                BRCLR 3,PROGRAM,FLS4AAA
                BRCLR 3,WHICH,FLS4AA
                CLR DIG4BUF
                BRA FLS4AAA
    FLS4AA:
                BSET 7,DIG4BUF
    FLS4AAA:
                BRCLR 6,PROGRAM,FLS5
                BRCLR 6,WHICH,FLS5A
                CLR DIG4BUF
                BRA FLS5
    FLS5A:
                BSET 7,DIG4BUF
    FLS5:
                BRCLR 0,PENDING,OUTOUT
                BSET 2,DIG5
    OUTOUT:

LDA DIG1BUF
                STA DIG1
                LDA DIG2BUF
                STA DIG2
                LDA DIG3BUF
                STA DIG3
                LDA DIG4BUF
                STA DIG4

ROUT:
                RTS
```

```
;***********************************************
;                                               *
;  IRQ interrupt routine                        *
;                                               *
;***********************************************
INT:
            brset 5,status,intout   ;wait for current int to complete due
to possible nest int LDA INTCOUNT
            CMP #14T        ;+*
            BCS INTOUT
            CLR INTCOUNT
            bra INTOK
INTOUT:
            RTI
INTOK:      ;gets here every 14 int
            ;following to control duty cycles for triacs,off as
evcount>levtab bset 5,status   ;set interupt in progress bit
            inc LEVCOUNT
            LDA LEVCOUNT
            CMP #11T
            BCS COUNTOK
            CLR LEVCOUNT
COUNTOK:
            BRCLR 0,STATE,RLFTOF
            LDX RLLEVEL
  ;         INCX
            LDA LEVTAB,X
            cmp #01h
            bne noflip
            brclr 1,halftog,rlftof  ;every other second  shall be off
  ;                                  so that 1 really = 1/2
noflip:
            CMP LEVCOUNT
            BCS RLFTOF
            BEQ RLFTOF
            BSET RLTRIAC,PORTD
            BRA RLTDUN
```

64

```
        RLFTOF:
                    BCLR RLTRIAC,PORTD
        RLTDUN:
        ;rearright rearright rearright rearright rearright BRCLR 1,STATE,RRTOF
                    LDX RRLEVEL
            ;        INCX
                    LDA LEVTAB,X
                    cmp #01h
                    bne noflip1
                    brclr 1,halftog,rRtof   ;every other second  shall be off
                    ;                        so that 1 really = 1/2
        noflip1:
                    CMP LEVCOUNT
                    BCS RRTOF
                    BEQ RRTOF
                    BSET RRTRIAC,PORTD
                    BRA RRTDUN
        RRTOF:
                    BCLR RRTRIAC,PORTD
        RRTDUN:

; FRONTLEFT FRONTLEFT FRONTLEFT FRONTLEFT FRONTLEFT FRONTLEFT
                    BRSET 2,STATE,FLTOF0
                    BRCLR 4,STATE,FLTOF
        FLTOF0:
                    LDX FLLEVEL
            ;        INCX
                    LDA LEVTAB,X
                    cmp #01h
                    bne noflip2
                    brclr 1,halftog,FLtof   ;every other second  shall be off
                    ;                        so that 1 really = 1/2
        noflip2:
                    CMP LEVCOUNT
                    BCS FLTOF
                    BEQ FLTOF
                    BSET FL1TRIAC,PORTE
                    BRA FLTDUN
        FLTOF:
                    BCLR FL1TRIAC,PORTE
        FLTDUN:
```

65

```
        ; FRONTRIGHT FRONTRIGHT FRONTRIGHT FRONTRIGHT FRONTRIGHT
                    BRSET 3,STATE,FRTOF0
                    BRCLR 6,STATE,FRTOF
        FRTOF0:
 5                  LDX FRLEVEL
            ;        INCX
                    LDA LEVTAB,X
                    cmp #01h
                    bne noflip3
10                  brclr 1,halftog,FRtof   ;every other second  shall be off
                    ;                        so that 1 really = 1/2
        noflip3:
                    CMP LEVCOUNT
                    BCS FRTOF
15                  BEQ FRTOF
                    BSET FR1TRIAC,PORTD
                    BRA FRTDUN
        FRTOF:
                    BCLR FR1TRIAC,PORTD
20      FRTDUN:

;if beep3=1,18,35 then beep. 3 beeps when lock and unlock
                    cli   ;allow nesting interupts
                    BRCLR 0,MAESTRO,BEEPD6
25                  INC BEEP3
                    LDA BEEP3
                    CMP #1H
                    BNE BEEPD1
                    BSET 0,BEEPTOG
30      BEEPD1:
                    CMP #18T
                    BNE BEEPD2
                    BSET 0,BEEPTOG
        BEEPD2:
35                  CMP #35T
                    BNE BEEPD6
                    BSET 0,BEEPTOG
                    bclr 0,maestro
                    clr beep3
40      BEEPD6:
                    BRCLR 0,PANIKFLG,NINCP
                    INC PANIKCNT
                    LDA PANIKCNT
```

```
                                        66
                    CMP #61T
                    BCS NINCP
                    CLR PANIKFLG
                    CLR PANIKCNT
 5      NINCP:

TST SCROLL ;a continuous press(SCRO 196t - FFH)make level move
                    BEQ NOSCRO
        GO:
10                  INC SCRO
                    BNE NOSCRO
                    LDA #226T
                    STA SCRO
        ;rrrrrrrrrrrrrrrrrrrrrrrrrrrrrrrrrrrrrrrrrrrrrrrrrr
15                  BRCLR 0,SCROLL,NRLUP
                    LDA RLLEVEL
                    CMP #11T
                    BCC NRLUP
                    INC RLLEVEL
20      NRLUP:
                    BRCLR 1,SCROLL,NRLDN
                    LDA RLLEVEL
                    CMP #2T
                    BCS NRLDN
25                  DEC RLLEVEL
        NRLDN:
                    BRCLR 2,SCROLL,NRRUP
                    LDA RRLEVEL
                    CMP #11T
30                  BCC NRRUP
                    INC RRLEVEL
        NRRUP:
                    BRCLR 3,SCROLL,NRRDN
                    LDA RRLEVEL
35                  CMP #2T
                    BCS NRRDN
                    DEC RRLEVEL
        NRRDN:
                    BRCLR 4,SCROLL,NFLUP
40                  LDA FLLEVEL
                    CMP #11T
                    BCC NFLUP
                    INC FLLEVEL
```

67

```
        NFLUP:
                    BRCLR 5,SCROLL,NFLDN
                    LDA FLLEVEL
                    CMP #2T
5                   BCS NFLDN
                    DEC FLLEVEL
        NFLDN:
                    BRCLR 6,SCROLL,NFRUP
                    LDA FRLEVEL
10                  CMP #11T
                    BCC NFRUP
                    INC FRLEVEL
        NFRUP:
                    BRCLR 7,SCROLL,NOSCRO
15                  LDA FRLEVEL
                    CMP #2T
                    BCS NOSCRO
                    DEC FRLEVEL

20      NOSCRO:

inc countlock
                    INC COUNTINT
                    LDA COUNTINT
25                  CMP #30T
                    BCS RETT
                    CLR COUNTINT ; GETS HERE EVERY HALF SECOND, 0.54m*countint(30)*intcount(29)
30                  INC HALFTOG  ;SO NAMED BECAUSE BIT 0 TOGGLES EVERY 1/2 SECOND
                    LDA HALFMIN
                    CMP #59T
                    BCS III
                    LDA #80T
35                  STA HALFMIN
                    CLR PENDING
        III:
                    INC HALFMIN
                    INC LOCKHALF   ;AAAA
40
                    LDA LOCKHALF   ;AAAA
                    CMP #120T
                    BCS AB
```

```
                                        68
                     INC MINUTE
                     CLR LOCKHALF     ;AAAA
          AB:
            ;        LDA HALFTOG
 5          ;        CMP #6T          ;AAAA
            ;        BCS AB1
            ;        BCLR 0,STATUS    ;END INIT MODE
          ;AB1:
                     BRSET 5,STATE,AB2
10                   LDA #01011111Q
                     AND STATE
                     ORA PROGRAM
                     TSTA
                     BNE AB2
15                   LDA MINUTE
                     CMP #10T
                     BCS STILLINT
                     BSET 5,STATE
                     BRA STILLINT
20        AB2:
                     CLR MINUTE
                     CLR LOCKHALF     ;AAAA
          STILLINT:
                     INC PROGOUT
25                   LDA PROGOUT
                     CMP #14T         ; flashing 7sec
                     BCS RETT
                     CLR PROGRAM
                     CLR WHICH
30                   CLR CHOOSE RETT:
                     sei
                     bclr 5,status    ;out of interupt flag
35                   RTI DISPTAB:
                FCB 00H ;A BLANK
                FCB 38H ;L
40              FCB 6H  ;1
                FCB 5BH ;2
                FCB 4FH ;3
                FCB 66H ;4
```

```
                    FCB 6DH ;5
                    FCB 7CH ;6
                    FCB 07H ;7
                    FCB 7FH ;8
5                   FCB 67H ;9
                    FCB 76H ;H

LEVTAB:
            ;         FCB 00H,01T,04T,06T,12T,15T,17T,20T,26T,38T,50T
10                    FCB 00H,01T,02T,03T,04T,05T,06T,07T,08T,09T,10T,11T
            ANALOG:
                    LDA #23H
                    STA ADCONT
            ADOVN:
15                  BRCLR 7,ADCONT,ADOVN
                    LDA ADATA      ; READING TAKES ABOUT 12 uSECS
                    CMP AMBDB      ;compare with temp
                    BNE NEWAMBDB
                    STA AMBT
20          NEWAMBDB:
                    STA AMBDB
            ;******************************
                    TST KEY
                    BEQ NOSET
25                  BSET 0,ALASTOP
            NOSET:
                    lda ambt
                    CMP #250T
                    BCS NNN
30                  JMP CANNALL
            NNN:
                    cmp #21t
                    bcc nocanall
                    JMP cannall   ;temp is > 85t
35
            nocanall:
                    BCLR 0,ALASTOP
                    LDA key
                    beq STILLHI
40          ALMOFF:
                    BCLR 6,STATUS ;TURN OFF 1/10 FLASHING
            STILLHI:
                    lda ambt
```

```
                                  70
                    cmp #72t      ;45C
                    bcs fanonn
                    cmp #90t      ;38C
                    bcc fanoff
 5                  rts
             fanonn:
                    bset fan,portb
                    rts
             fanoff:
10                  bclr fan,portb
                    RTS CANNALL:
                    BRSET 0,ALASTOP,CCC
15                  BSET 0,MAESTRO
             CCC:
                    CLR CHOOSE
                    CLR PROGRAM
                    CLR STATE
20                  CLR WHICH
                    bset 6,status   ;set temp to high alarm
                    rts
             alarm:
                    BRCLR 0,HALFTOG,BLINKIT
25                  BRSET 1,STATUS,E2
                    LDA #5CH
                    STA DIG1
                    STA DIG2
                    STA DIG3
30                  STA DIG4
                    CLR DIG5
                    RTS
             E2:
                    TST KEY
35                  BEQ E2A
                    BSET 1,ALASTOP
             E2A:
                    LDA HALFTOG
                    CMP #120T
40                  BCS E3
                    BSET 1,ALASTOP
             E3:
                    LDA #01110001Q
```

Although preferred embodiments of the invention have been described in detail herein and illustrated in the accompanying drawings, it is to be understood that the invention is not limited to these precise embodiments and that various changes and modifications may be effected therein without departing from the scope or spirit of the present invention.

What is claimed is:

1. A padless touch sensor for detecting a touch at a sensing location onto a dielectric element by a user coupled to earth, the sensor comprising:

a conductive plate;

a means for attaching the conductive plate under the dielectric element and in registry with the sensing location;

a means for applying a predetermined potential on the conductive plate;

a test pulse generating means for producing test pulses into earth; and a means responsive to a potential variation in the conductive plate for producing an output signal indicative of the potential variation;

whereby, when the user touches the dielectric element at the sensing location, a potential variation occurs in the conductive plate during a test pulse due to a capacitive circuit formed between earth, the user and the means responsive to the potential variation.

2. A padless touch sensor according to claim 1, wherein the test pulse generating means comprises:

a resistor having an input terminal and an output terminal, the input terminal being connected to a DC source and the output terminal being connected to earth, a transistor having a collector, an emitter and a base, the collector being connected to the output terminal of the resistor and the emitter being connected to circuit ground; and a means for generating a pulsed signal at the base of the transistor.

3. A padless touch sensor according to claim 1, wherein the means for applying a predetermined potential and the means responsive to a potential variation comprise:

a first resistor having an input terminal and an output terminal, the input terminal of the first resistor being connected to a DC source and the output terminal of the first resistor being connected to the conductive plate, a transistor having a collector, an emitter and a base, the collector being connected to the DC source and the base being connected to the conductive plate and to the output terminal of the first resistor; and a second resistor having an input terminal and an output terminal, the input terminal of the second resistor being connected to the emitter of the transistor and the output terminal of the second resistor being connected to circuit ground;

whereby the output signal is read at the input terminal of the second resistor.

4. A padless touch sensor for detecting a touch at sensing locations onto a dielectric element by a user coupled to earth, the sensor comprising:

a plurality of conductive plates, one for each sensing location;

a means for attaching each conductive plate under the dielectric element and in registry with a respective sensing location;

a means for successively applying a predetermined potential on one of the conductive plates at once;

a test pulse generating means for producing a test pulse into earth while one of the conductive plates receives the predetermined potential; and a means responsive to a potential variation in the conductive plate with the predetermined potential for producing an output signal indicative of the potential variation in that conductive plate;

whereby, when the user touches the dielectric element at one of the sensing locations, a potential variation occurs in the conductive plate during a test pulse due to a capacitive circuit formed between earth, the user and the means responsive to the potential variation.

5. A padless touch sensor according to claim 4, wherein the test pulse generating means comprises:

a resistor having an input terminal and an output terminal, the input terminal being connected to a DC source and the output terminal being connected to earth, a transistor having a collector, an emitter and a base, the collector being connected to the output terminal of the resistor and the emitter being connected to circuit ground; and a means for generating a pulsed signal at the base of the transistor.

6. A padless touch sensor according to claim 4, wherein the means for applying a predetermined potential and the means responsive to a potential variation comprise:

a plurality of first resistors, each having an input terminal and an output terminal, the input terminal of each first resistor being connected to a DC source and the output terminal of each first resistor being connected to a respective conductive plate;

a plurality of transistors, each having a collector, an emitter and a base, the collector of each transistor being connected to the DC source and the base of each transistor being connected to a respective conductive plate and to the output terminal of the respective first resistor;

a second resistor having an input terminal and an output terminal, the input terminal of the second resistor being connected to the emitter of each transistor and the output terminal of the second resistor being connected to circuit ground; and a means for selectively connecting the conductive plates to the circuit ground except the one with the predetermined potential;

whereby the output signal is read at the input terminal of the second resistor.

7. A padless touch sensor according to claim 4, further comprising a circuit ground plane surrounding the sensing locations to shield conductive traces originating from the conductive plates.

8. A padless touch sensor for detecting a touch at sensing locations onto a dielectric element by a user coupled to earth, the sensor comprising:

a plurality of conductive plates, one for each sensing location;

a means for attaching each conductive plate under the dielectric element and in registry with a respective sensing location;

a means for applying a predetermined potential on the conductive plates;

a test pulse generating means for producing test pulses into earth; and a means responsive to a potential variation in the conductive plates with the predetermined potential for producing output signals indicative of the potential variation in each of the conductive plates;

whereby, when the user touches the dielectric element at one of the sensing locations, a potential variation occurs in the corresponding conductive plate during a test pulse due to a capacitive circuit formed between earth, the user and the means responsive to the potential variation.

9. A padless touch sensor according to claim 8, wherein the test pulse generating means comprises:

a resistor having an input terminal and an output terminal, the input terminal being connected to a DC source and the output terminal being connected to earth, a transistor having a collector, an emitter and a base, the collector being connected to the output terminal of the resistor and the emitter being connected to circuit ground; and a means for generating a pulsed signal at the base of the transistor.

10. A padless touch sensor according to claim 8, further comprising a circuit ground plane surrounding the sensing locations to shield conductive traces originating from the conductive plates.

11. A method for detecting a touch at a sensing location onto a dielectric element by a user coupled to earth, the method comprising the steps of:

applying a predetermined potential on a conductive plate attached under the dielectric element and in registry with the sensing location;

producing test pulses into earth;

sensing a potential variation on the conductive plate; and producing an output signal indicative of the potential variation.

12. A method for detecting a touch according to claim 11, further comprising the steps of:

comparing the output signal to a reference level; and producing a signal indicative of a touch at the sensing location when the potential variation on the conductive plate is greater than the reference level.

13. A method for detecting a touch at sensing locations onto a dielectric element by a user coupled to earth, each sensing location being provided with a corresponding conductive plate attached under the dielectric element and in registry with the respective sensing location, the method comprising the steps of:

successively applying a predetermined potential on one of the conductive plates at once;

producing a test pulse into earth while the predetermined potential is applied on one conductive plate;

sensing a potential variation in each of the conductive plates while the predetermined potential is applied thereon; and producing an output signal indicative of the potential variation in each of the conductive plates while the predetermined potential is individually applied thereon.

14. A method for detecting a touch according to claim 13, wherein the step of successively applying a predetermined potential on one of the conductive plates at once comprises connecting the conductive plates to circuit ground except the one with the predetermined potential.

15. A method for detecting a touch according to claim 14, further comprising the steps of:

comparing the output signal to a reference level; and producing a signal indicative of a touch at one of the sensing locations when the potential variation on the corresponding conductive plate is greater than the reference level.

16. A method for detecting a touch according to claim 13, further comprising the steps of:

comparing the output signal to a reference level; and producing a signal indicative of a touch at one of the sensing locations when the potential variation on the corresponding conductive plate is greater than the reference level.

17. A method for detecting a touch at sensing locations onto a dielectric element by a user coupled to earth, each sensing location being provided with a corresponding conductive plate attached under the dielectric element and in registry with the respective sensing location, the method comprising the steps of:

applying a predetermined potential on the conductive plates;

producing test pulses into earth;

sensing a potential variation in each of the conductive plates; and producing output signals indicative of the potential variation in each of the conductive plates while they are being sensed.

18. A method for detecting a touch according to claim 17, further comprising the steps of:

comparing the output signals to a reference level; and producing a signal indicative of a touch at one of the sensing locations when the potential variation on the corresponding conductive plate is greater than the reference level.

\* \* \* \* \*